US012685150B2

(12) United States Patent
    Lin et al.

(10) Patent No.: US 12,685,150 B2
(45) Date of Patent: Jul. 14, 2026

(54) EXTENDED VIA CONNECT FOR PIXEL ARRAY

(71) Applicant: Taiwan Semiconductor Manufacturing Company, Ltd., Hsinchu (TW)

(72) Inventors: Meng-Hsien Lin, Tainan City (TW); Hsing-Chih Lin, Tainan City (TW); Ming-Tsong Wang, Taipei City (TW); Min-Feng Kao, Chiayi City (TW); Kuan-Hua Lin, New Taipei City (TW); Jen-Cheng Liu, Hsin-Chu City (TW); Dun-Nian Yaung, Taipei City (TW); Ko Chun Liu, Toufen Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 644 days.

(21) Appl. No.: 18/149,284

(22) Filed: Jan. 3, 2023

(65) Prior Publication Data

US 2024/0096784 A1 Mar. 21, 2024

Related U.S. Application Data

(60) Provisional application No. 63/408,495, filed on Sep. 21, 2022.

(51) Int. Cl.
    H10W 20/40 (2026.01)
    H10F 39/00 (2025.01)

(52) U.S. Cl.
    CPC ........ H10W 20/496 (2026.01); H10F 39/011 (2025.01); H10F 39/809 (2025.01); H10F 39/811 (2025.01)

(58) Field of Classification Search
    CPC .. H10W 20/496; H10F 39/011; H10F 39/809; H10F 39/811
    See application file for complete search history.

(56) References Cited

U.S. PATENT DOCUMENTS

| | | | |
|---|---|---|---|
| 10,825,849 B2 | 11/2020 | Ezaki et al. | |
| 2014/0042445 A1 | 2/2014 | Kao et al. | |
| 2017/0178951 A1* | 6/2017 | Ting ................... | H10W 20/084 |
| 2020/0135844 A1 | 4/2020 | Takahashi et al. | |
| 2022/0231058 A1 | 7/2022 | Kao et al. | |
| 2022/0293503 A1 | 9/2022 | Huang et al. | |

OTHER PUBLICATIONS

Stark et al. "A Back-Illuminated Voltage-Domain Global Shutter Pixel With Dual In-Pixel Storage" IEEE Transactions on Electron Devices ( vol. 65, Issue: 10, Oct. 2018), published on Sep. 13, 2018.

* cited by examiner

*Primary Examiner* — Suberr L Chi
(74) *Attorney, Agent, or Firm* — Eschweiler & Potashnik, LLC

(57) ABSTRACT

Some embodiments of the present disclosure relate to an integrated chip including an extended via that spans a combined height of a wire and a via and that has a smaller footprint than the wire. The extended via may replace a wire and an adjoining via at locations where the sizing and the spacing of the wire are reaching lower limits. Because the extended via has a smaller footprint than the wire, replacing the wire and the adjoining via with the extended via relaxes spacing and allows the size of the pixel to be further reduced. The extended via finds application for capacitor arrays used for pixel circuits.

20 Claims, 20 Drawing Sheets

2500 ⟶

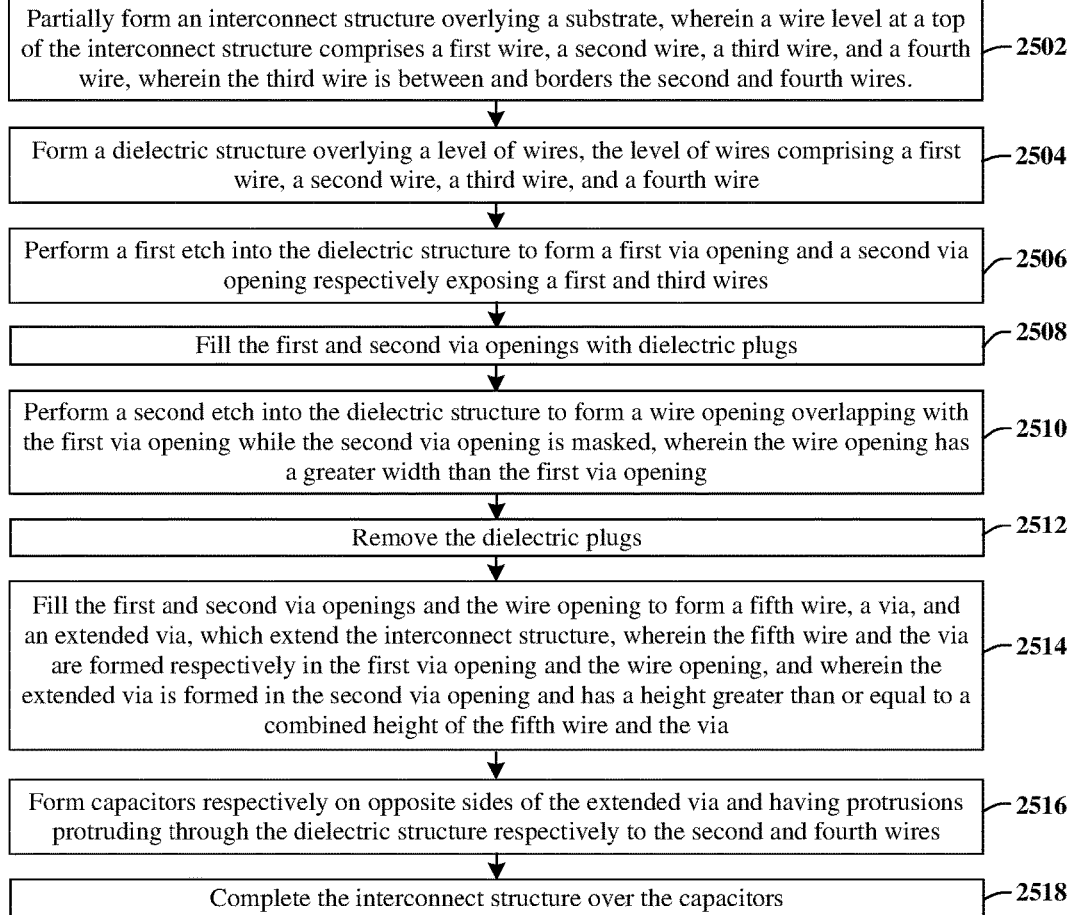

| | |
|---|---|
| Partially form an interconnect structure overlying a substrate, wherein a wire level at a top of the interconnect structure comprises a first wire, a second wire, a third wire, and a fourth wire, wherein the third wire is between and borders the second and fourth wires. | 2502 |
| Form a dielectric structure overlying a level of wires, the level of wires comprising a first wire, a second wire, a third wire, and a fourth wire | 2504 |
| Perform a first etch into the dielectric structure to form a first via opening and a second via opening respectively exposing a first and third wires | 2506 |
| Fill the first and second via openings with dielectric plugs | 2508 |
| Perform a second etch into the dielectric structure to form a wire opening overlapping with the first via opening while the second via opening is masked, wherein the wire opening has a greater width than the first via opening | 2510 |
| Remove the dielectric plugs | 2512 |
| Fill the first and second via openings and the wire opening to form a fifth wire, a via, and an extended via, which extend the interconnect structure, wherein the fifth wire and the via are formed respectively in the first via opening and the wire opening, and wherein the extended via is formed in the second via opening and has a height greater than or equal to a combined height of the fifth wire and the via | 2514 |
| Form capacitors respectively on opposite sides of the extended via and having protrusions protruding through the dielectric structure respectively to the second and fourth wires | 2516 |
| Complete the interconnect structure over the capacitors | 2518 |

Fig. 25

EXTENDED VIA CONNECT FOR PIXEL ARRAY

REFERENCE TO RELATED APPLICATION

This Application claims the benefit of U.S. Provisional Application No. 63/408,495, filed on Sep. 21, 2022, the contents of which are hereby incorporated by reference in their entirety.

BACKGROUND

Many modern day electronic devices contain digital image sensors. Digital image sensors may be backside illumination sensors or frontside illumination sensors. Backside illumination sensors can increase the amount of light captured by the sensor while frontside illumination sensors have a greater response uniformity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 25 illustrates a flow diagram of some embodiments of a method of forming an integrated chip comprising a pixel circuit and extended vias.

DETAILED DESCRIPTION

Figure 1:
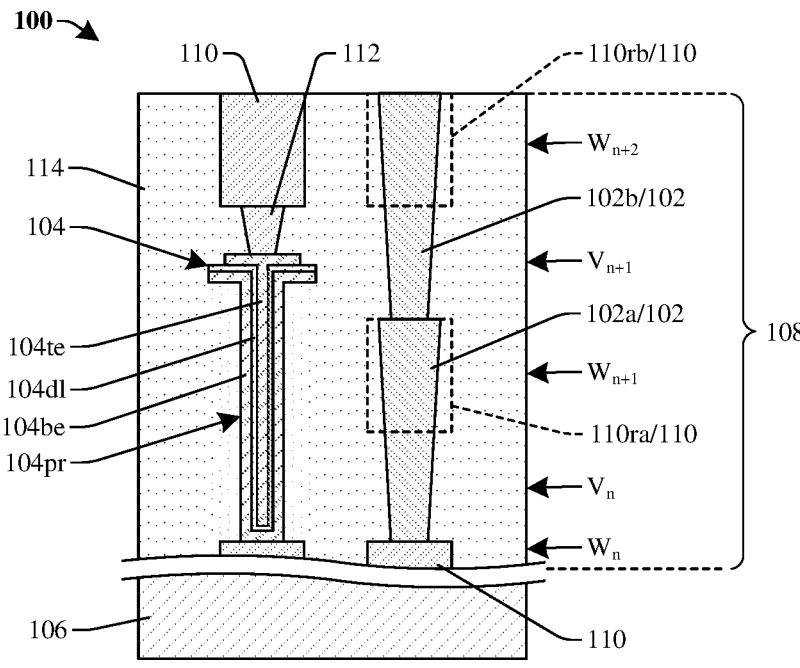
FIG. 1 illustrates a cross-sectional view of some embodiments of an integrated chip comprising extended vias.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor may comprise a first integrated circuit (IC) chip and a second IC chip that are vertically stacked in a semiconductor structure. Further, the image sensor may comprise a pixel that is spread across the first and second IC chips and that repeats in a plurality of rows and a plurality of columns to form a pixel array. The pixel comprises a plurality of components, including a photodiode, a plurality of transistors, and a plurality of capacitors.

Interconnect structures individual to the first and second IC chips are electrically coupled together and form conductive paths electrically coupling the components together. Further, the interconnect structures comprise a plurality of wires and a plurality of vias. The wires provide lateral routing and have larger footprints than the vias, and the vias provide vertical routing. The wires and the vias are respectively grouped into a plurality of wire levels and a plurality of via levels alternatingly stacked to form the conductive paths.

As technology improves, smaller and smaller pixels are developed, thereby leading to improvements in image resolution. However, as pixel size shrinks, the size and/or the spacing between conductive features (e.g., wires, vias, etc.) of the interconnect structures shrink. Further, at a certain point, the size and/or the spacing between the conductive features reach lower limits, below which leakage and capacitance effects become unmanageable. As such, the interconnect structures may limit the scaling down of the pixel.

To further reduce the size of a pixel while maintaining sufficient sizing and spacing for the conductive features of the interconnect structures, the present disclosure provides an extended via that spans a combined height of a wire and a via and that has a smaller footprint than the wire. The extended via may replace a wire and an adjoining via at locations where the sizing and the spacing of the wire are reaching lower limits. Because the extended via has a smaller footprint than the wire, replacing the wire and the adjoining via with the extended via relaxes spacing and allows the size of the pixel to be further reduced.

FIG. 1 illustrates a cross-sectional view 100 of some embodiments of an integrated chip comprising extended vias.

As shown in the cross-sectional view 100 of FIG. 1, a capacitor 104 is over a substrate 106 in an interconnect structure 108. The interconnect structure 108 covers the substrate 106 and comprises a plurality of wires 110 and a plurality of vias 112 in a dielectric structure 114. The wires 110 provide lateral routing and have larger footprints (e.g., top down projections) than the vias 112. The vias 112 provide vertical routing between the wires 110.

The wires 110 are respectively grouped into a plurality of a wire levels and a plurality via levels that are alternatingly stacked to form conductive paths. A wire level $W_n$ underlies the capacitor 104, and a wire level $W_{n+2}$ overlies the capacitor 104. Further, while not readily seen, a wire level $W_{n+1}$ is between the wire level $W_n$ and the wire level $W_{n+2}$. A via level $V_{n+1}$ overlies the capacitor 104, between the wire level $W_{n+2}$ and the capacitor 104. Further, while not readily seen, a via level $V_n$ is between the wire level $W_n$ and wire level $W_{n+1}$. Note that n is an integer representing a wire or via level and increases away from the substrate 106.

The interconnect structure 108 further comprises a plurality of extended vias 102. The extended vias 102 have individual heights greater than or equal to a combined height of a wire 110 and an adjoining via 112. Further, the extended vias 102 have individual widths less than individual widths of the wires 110. As seen hereafter, the extended vias 102 further have individual footprints less than individual footprints of the wires 110. A footprint may, for example, correspond to a two-dimensional projection onto a top surface of the substrate 106.

The extended vias 102 replace wires and adjoining vias at locations where the sizing and the spacing of the wires are at lower limits, below which leakage and capacitance effects become unmanageable. For example, a first extended via 102a may replace a first wire 110ra (shown in phantom) and a first via (not shown), and a second extended via 102b may replace a second wire 110rb (shown in phantom) and a second via (not shown).

Supposing sizing and spacing of the first and second wire 110ra, 110rb are at lower limits, the first and second wires 110ra, 110rb may limit scaling down of the integrated chip. However, because the extended vias 102 have lesser widths and lesser footprints that the first and second wires 110ra, 110rb, the replacement relaxes spacing and sizing constrains and allows scaling down of the integrated chip.

With continued reference to FIG. 1, the capacitor 104 comprises a bottom electrode 104be, a dielectric layer 104dl overlying the bottom electrode 104be, and a top electrode 104te overlying the dielectric layer 104dl. The top electrode 104te is electrically coupled to the wire level $W_{n+2}$ by a via 112 of the via level $V_{n+1}$ extending therebetween. The bottom electrode 104be, the dielectric layer 104dl, and the top electrode 104te form a protrusion 104pr that extends downward to electrically couple the bottom electrode 104be to the wire level $W_n$. In some embodiments, the capacitor 104 is a trench capacitor, but other suitable types of capacitor are amenable in alternative embodiments. In some embodiments, the bottom electrode 104be and the top electrode 104te comprises titanium nitride (TiN), or the like.

The first extended via 102a extends from the wire level $W_n$ to the second extended via 102b. The second extended via 102b overlies the first extended via 104a and extends from an interface with the first extended via 102a, which is level with the protrusion 104pr, to an elevation above a top surface of the capacitor 104. In some embodiments, the elevation is level with a top surface of the wire level $W_{n+2}$.

In some embodiments, the extended vias 102, the wires 110, and the vias 112, or any combination of the foregoing are or comprise polysilicon, copper (Cu), titanium nitrate (TiN), tungsten (W), aluminum (Al), tantalum nitrate (TaN), the like, or any combination of the foregoing. In some embodiments, the substrate 106 comprises one of a bulk semiconductor, a semiconductor-on-insulator (SOI) substrate, or the like, which may be doped (e.g., with a p-type or an n-type dopant) or undoped.

In some embodiments, a top surface of an extended via (e.g., any one of the extended vias 102) has a width approximately between 0.3 micrometers and 1 micrometer, approximately between 0.2 micrometers and 0.5 micrometers, approximately between 0.7 micrometers and 1.2 micrometers, or within another suitable range. In some embodiments, a ratio of the width of the top surface of the extended via to a width of a bottom surface of the extended via is between 1.1 and 2.5.

Figure 2:
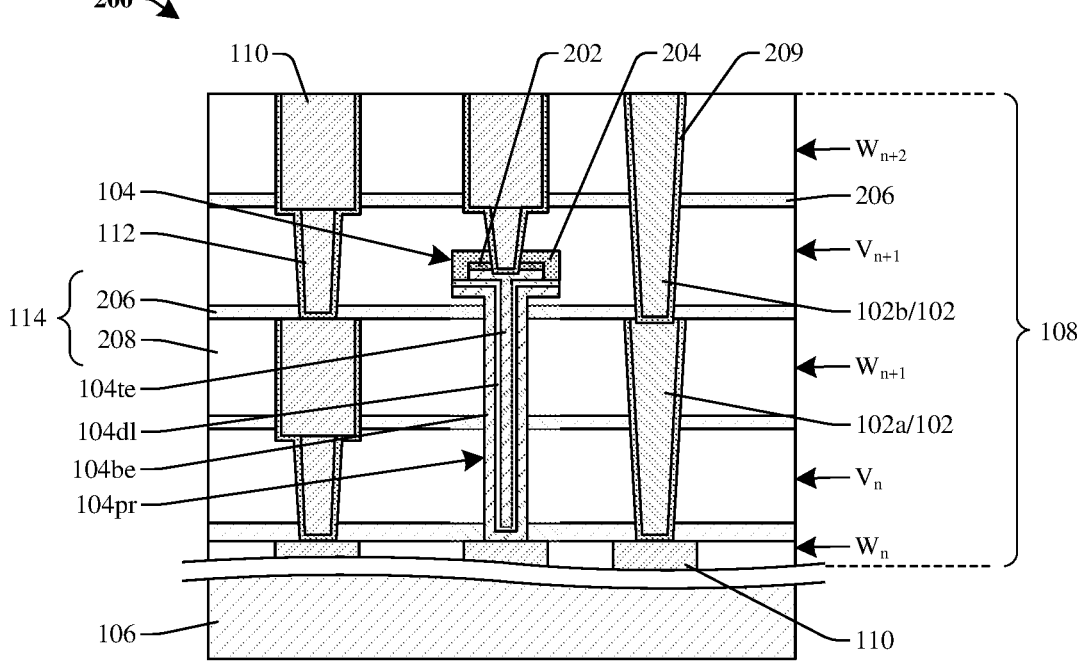
FIG. 2 illustrates a cross-sectional view of some embodiments of the integrated chip with additional detail.

FIG. 2 illustrates a cross-sectional view 200 of some embodiments of the integrated chip with additional detail.

As shown in the cross-sectional view 200 of FIG. 2, additional wires 110 and additional vias 112 of the interconnect structure 108 are shown on an opposite side of the capacitor 104 as the extended vias 102. Additionally, the capacitor 104 is masked by a passivation layer 204 and an anti-reflect coating 202 between the capacitor 104 and the passivation layer 204. The dielectric structure 114 includes a plurality of etch stop layers (ESLs) 206 and a plurality of interconnect dielectric layers 208. The ESLs 206 and the interconnect dielectric layers 208 are alternatingly stacked to facilitate formation of the interconnect structure 108. In some embodiments, a barrier layer 209 surrounds the extended vias 102 and the vias 112.

In some embodiments, the passivation layer 204 comprises a nitride (e.g., silicon nitride), or the like. In some embodiments, the anti-reflect coating 202 comprises silicon oxynitride or the like. In some embodiments, the interconnect dielectric layers 208 are or comprises an oxide (e.g., silicon dioxide), a low-κ dielectric material, an extreme low-κ dielectric material, the like or any combination of the foregoing. In some embodiments, the ESLs 206 are or comprise silicon carbide, silicon nitride, the like, or any combination of the foregoing.

Figure 3:
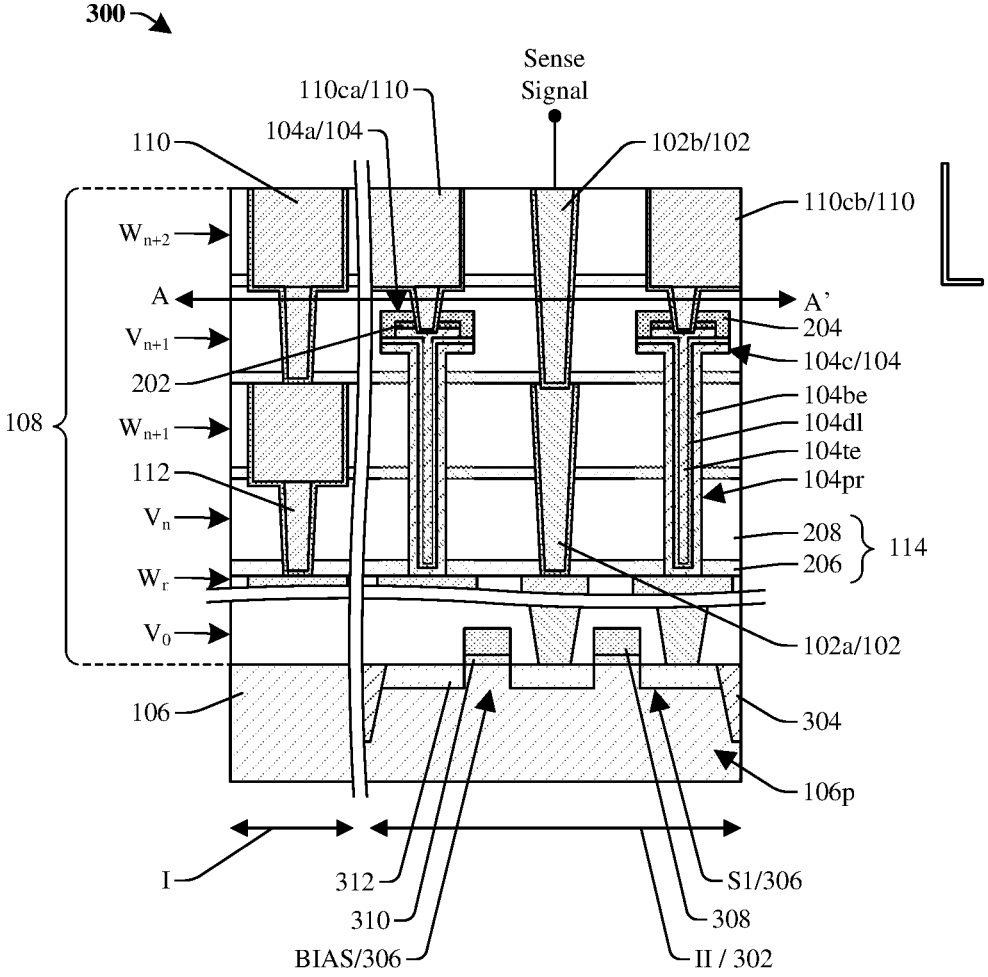
FIG. 3 illustrates a cross-sectional view of some embodiments of an integrated chip comprising a pixel circuit and extended vias.

FIG. 3 illustrates a cross-sectional view 300 of some embodiments of an integrated chip comprising a pixel circuit and extended vias.

As shown in the cross-sectional view 300 of FIG. 3, the integrated chip comprises a peripheral region I and a central region II surrounded by the peripheral region I (only partially shown). The central region II accommodates a pixel circuit 302, whereas the peripheral region I may accommodate logic devices, other suitable devices, or no devices. As seen hereafter, the pixel circuit 302 may receive a signal corresponding to radiation sensed by a photodiode (not shown) on another integrated chip. In some embodiments, the pixel circuit 302 repeats in a plurality of rows and a plurality of columns to form a pixel array at the central region II.

A pixel region 106p of a substrate 106 supports the pixel circuit 302. The pixel region 106p is individual to the pixel circuit 302, and is surrounded and demarcated by a trench isolation structure 304. The trench isolation structure 304 comprises dielectric material and may, for example, be or comprise a shallow trench isolation (STI) structure, a deep trench isolation (DTI) structure, the like, or any combination of the foregoing.

The pixel circuit 302 comprises a plurality of components, including a plurality of transistors 306 and a plurality of capacitors 104. The transistors 306 are on the substrate 106 at the pixel region 106p and comprise a bias transistor BIAS and a first storage-selection transistor S1. The capacitors 104 are over the pixel region 106p in an interconnect structure 108 and comprise a first capacitor 104a and a third capacitor 104c. The first and third capacitors 104a, 104c are as their counterpart is described with regard to FIGS. 1 and 2.

The transistors 306 comprise individual gate electrodes 308, individual gate dielectric layers 310, and corresponding pairs of source/drain regions 312. The gate electrodes 308 are stacked respectively with the gate dielectric layers 310 to form gate stacks, which are sandwiched between corresponding source/drain regions 312. Note that source/drain region(s) may refer to a source or a drain, individually or collectively dependent upon the context.

The interconnect structure 108 covers the transistors 306 and forms conductive paths electrically coupling the components of the pixel circuit 302 together. Further, the interconnect structure 108 is as described with regard to FIGS. 1 and 2. Hence, the interconnect structure 108 comprises a plurality of wires 110, a plurality of vias 112, and a plurality of extended vias 102 stacked in the dielectric structure 114 to form the conductive paths. Further, the extended vias 102 comprise the first and second extended vias 102a, 102b.

In some embodiments, the bias transistor BIAS and the storage-selection transistor S1 share a common source/drain region electrically coupled to the first and second extended vias 102a, 102b. In some embodiments, the first and second extended vias 102a, 102b electrically couple the common source/drain region to another integrated chip, from which a signal corresponding to radiation sensed by a photodiode (not shown) is received. In alternative embodiments, the bias transistor BIAS and the storage-selection transistor S1 do not share the common source/drain region and/or only have individual source/drain regions.

Figure 4:
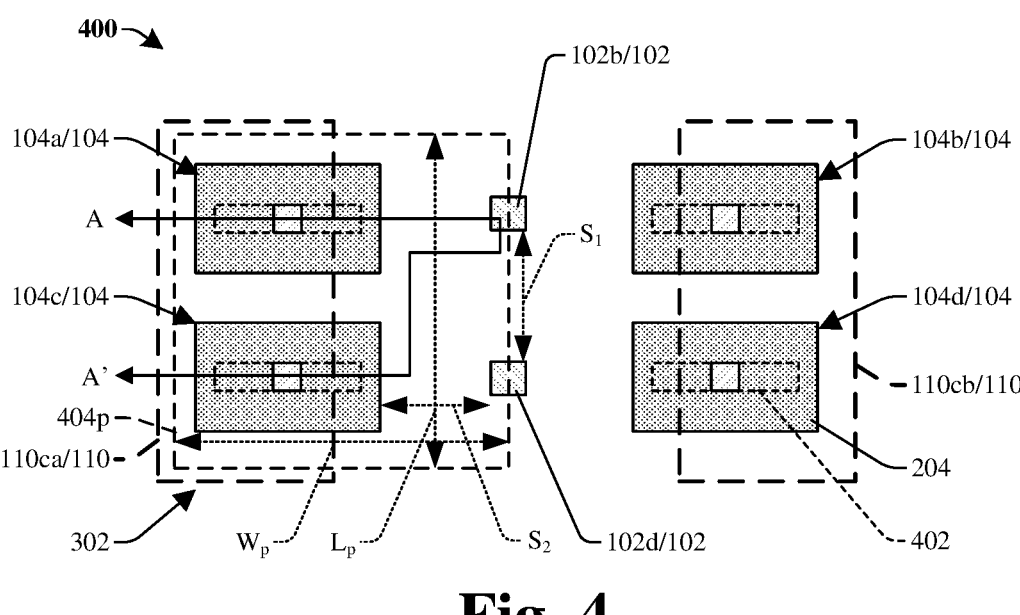
FIG. 4 illustrates a top layout view of some embodiments of the pixel circuit of FIG. 3.

FIG. 4 illustrates a top layout view 400 of some embodiments of the pixel circuit of FIG. 3. The cross-sectional view 300 of FIG. 3 may, for example, be taken along line A-A' in FIG. 4, and/or the top layout view 400 of FIG. 4 may, for example, be taken along line A-A' in FIG. 3.

As shown in the top layout view 400 of FIG. 4, the plurality of capacitors 104 comprises the first and third capacitors 104a, 104c, and further comprise a second capacitor 104b and a fourth capacitor 104d. The capacitors 104 are arranged in two rows and two columns, and trenches 402 of the capacitors 104 are shown in phantom. The trenches 402 correspond to portions of the capacitors at which the protrusions 104pr of FIG. 3 are arranged.

The first and third capacitors 104a, 104c are electrically coupled to a first common wire 110ca (shown in phantom) that overlies the first and third capacitors 104a, 104c when viewed in cross section. Further, the first and third capacitors 104a, 104c overlap with a second pixel region 404p (shown in phantom) in another integrated chip. In some embodiments, the first and third capacitors 104a, 104c entirely overlap with the second pixel region 404p. As seen hereafter, the second pixel region 404p corresponds to a photodiode and a second pixel circuit to which the pixel circuit 302 is electrically coupled.

In contrast with the first and third capacitors 104a, 104c, the second and fourth capacitors 104b, 104d are laterally offset from the second pixel region 404p, and are coupled to a second common wire 110cb (shown in phantom) that overlies the second and fourth capacitors 104b, 104d when viewed in cross section. In some embodiments, the second and fourth capacitors 104b, 104d not overlap with the second pixel region 404p.

The second pixel region 404p has a length $L_p$ and a width $W_p$. In some embodiments, the length $L_p$ is roughly equal to the width $W_p$. In some embodiments, the length $L_p$ and the width $W_p$ are about 1.3 micrometers, 1.3-1.75 micrometers, about 1-2 micrometers, or other suitable values. In some embodiments, the length $L_p$ and the width $W_p$ are greater than 1.3 micrometers or some other suitable value.

The plurality of extended vias 102 comprises the first extended via 102a (not shown) and the second extended via 102b, and further comprises a third extended via (not shown) and a fourth extended via 102d. The third extended via underlies the fourth extended via 102d when viewed in cross section, similar to how the first extended via 102a underlies the second extended via 102b when viewed in cross section (e.g., in the cross-sectional view 300 of FIG. 3). The second extended via 102b is arranged in a row with the first and second capacitors 104a, 104b and is between the first and second capacitors 104a, 104b. The fourth extended via 102d is arranged in a row with the third and fourth capacitors 104c, 104d and is between the third and fourth capacitors 104c, 104d. In some embodiments, the second and fourth extended vias 102b, 102d overlap with a boundary of the second pixel region 404p.

The second and fourth extended vias 102b, 102d are spaced from each other by a first spacing $S_1$, and are spaced from the capacitors 104 by a second spacing $S_2$. In some embodiments, the first spacing $S_1$ and/or the second spacing $S_2$ is/are about 0.3-0.5 micrometers, about 0.2-0.4 micrometers, about 0.35-0.55 micrometers, or some other suitable value. Because the extended vias 102 have smaller footprints than wires (e.g., 110 in FIG. 3), as described above, replacing wires with the extended vias 102 may relax spacing constraints and allows the capacitors 104 to get closer to each other than would otherwise be possible. This, in turn, allows the second pixel region 404p to be reduced in size. The second extended via 102b, the first capacitor 104a, and the third capacitor 104c correspond to the first pixel circuit 302, as described in relation to FIG. 3. The fourth extended via 102d, the second capacitor 104b, and the fourth capacitor 104d correspond to an additional pixel circuit. In some embodiments, the first pixel circuit 302 entirely overlaps with the second pixel region 404p. In other embodiments, the first pixel circuit 302 extends past the second pixel region 404p.

Figure 5A:
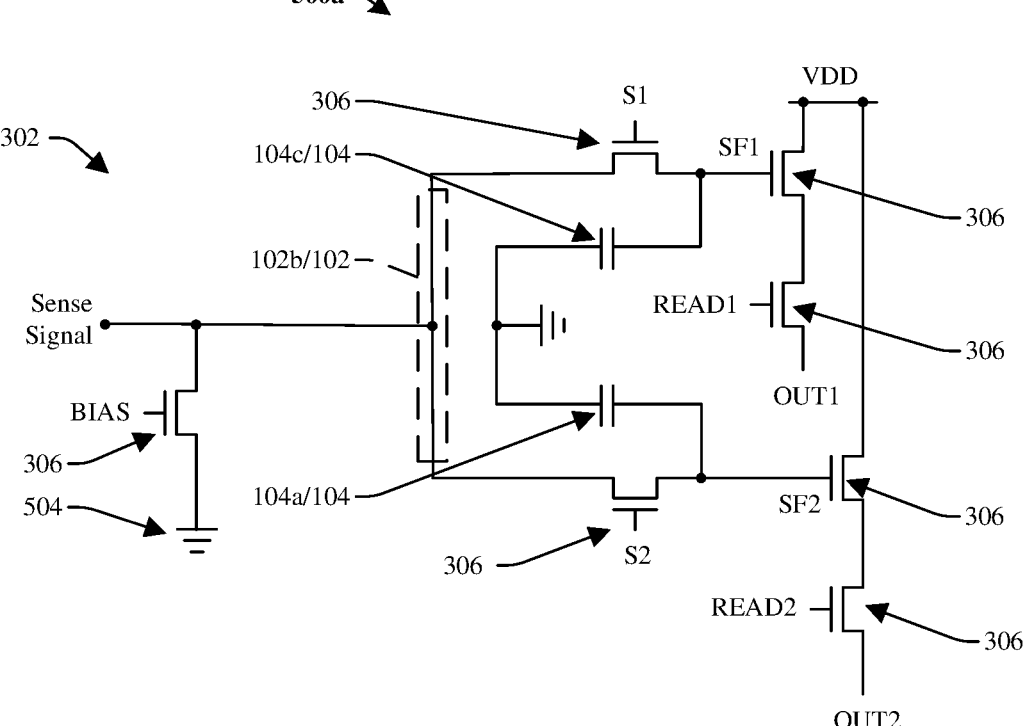
FIGS. 5A and 5B illustrate circuit diagrams of some embodiments of the pixel circuit of FIG. 3.
Figure 5B:
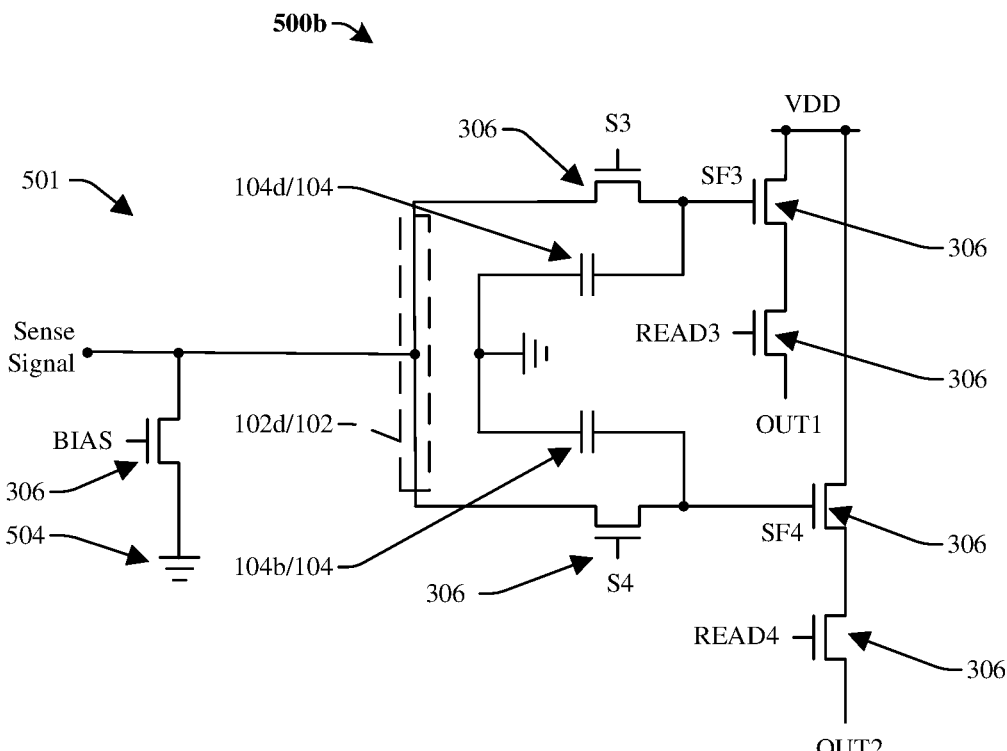

FIGS. 5A and 5B illustrate circuit diagrams 500a, 500b of some embodiments of the pixel circuit of FIG. 3.

As shown in the circuit diagram 500a of FIG. 5A, the second extended via 102b, the first capacitor 104a, and the third capacitor 104c correspond to the first pixel circuit 302. The first pixel circuit 302 is configured to receive a sense signal through the second extended via 102b. That is to say, the second extended via 102b carries the sense signal to the first pixel circuit 302. As will be seen hereafter, the sense signal corresponds to a signal sensed by a photodiode of the pixel to which the first pixel circuit 302 belongs. The first pixel circuit 302 comprises a plurality of capacitors 104 and a plurality of transistors 306, which are interconnected by the interconnect structure 108 of FIG. 3. Further, the plurality of transistors 306 comprise a first source-follower transistor SF1, a second source-follower transistor SF2, the first storage-selection transistor S1, a second storage-selection transistor S2, the bias transistor BIAS, a first read transistor READ1, and a second read transistor READ2. In some embodiments, the transistors 306 comprise additional transistors.

The plurality of capacitors 104 comprise the first capacitor 104a and a third capacitor 104a. Each capacitor is configured to store charge. The capacitors are configured to independently store voltages of the sense signal, which may be used for correlated double sampling (CDS), high dynamic range imaging (HDR) via exposure bracketing, or to generate separate images.

The first capacitor 104a is electrically coupled respectively from the second storage-selection transistor S2 to ground 504 or some other suitable voltage. Similarly, the third capacitor 104c is electrically coupled respectively from the first storage-selection transistor S1 to ground 504 or some other suitable voltage.

The bias transistor BIAS is electrically coupled from ground 504 or some other suitable voltage to the sense signal, and is configured to enable sampling/measuring of the sense signal. As will be better seen hereafter, when the bias transistor BIAS is in an OFF state, the sense signal is essentially disabled.

The first and second storage-select transistors S1, S2 are electrically coupled from the sense signal and the bias transistor BIAS respectively to the first capacitor 104a and the third capacitor 104c. The first storage-select transistor S1 is configured to selectively electrically couple the first capacitor to the sense signal to store a voltage of the sense signal in the first capacitor. The second storage-select transistor S2 is configured to selectively electrically couple the third capacitor to the sense signal to store a voltage of the sense signal in the third capacitor.

The first and second source-follower transistors SF1, SF2 are gated respectively by charge at the first and third capacitors, and are electrically coupled from a supply voltage $V_{DD}$ respectively to the first and second read transistors READ1, READ2. The first and second first and second read transistors READ1, READ2 are electrically coupled respectively from the first and second source-follower transistors SF1, SF2 respectively to a first output OUT1 and a second output OUT2. The first and second source-follower transistors SF1, SF2 are configured to buffer and amplify voltages respectively at the first and third capacitors for non-destructively reading the voltages. The first and second read transistors READ1, READ2 are configured to selectively pass buffered and amplified voltages respectively from the first and second source-follower transistors SF1, SF2 respectively to the first and second outputs OUT1, OUT2.

As shown in the circuit diagram 500b of FIG. 5B, the fourth extended via 102d, the second capacitor 104b, and the fourth capacitor 104d correspond to the additional pixel circuit 501. The additional pixel circuit 501 is configured to behave identically to the first pixel circuit 302, except it utilizes different circuit elements. In some embodiments, the additional pixel circuit 501 is configured to receive a sense signal through the fourth extended via 102d. Due to the similarity in function between the fourth extended via 102d and the second extended via 102b, it can be said that the fourth extended via 102d of the additional pixel circuit 501 corresponds to the second extended via 102b of the first pixel circuit 302. In the same fashion, a third source-follower transistor SF3, a fourth source-follower transistor SF4, the third storage-selection transistor S3, a fourth storage-selection transistor S4, a bias transistor BIAS, a third read transistor READ3, and a fourth read transistor READ4 respectively correspond to the first source-follower transistor SF1, the second source-follower transistor SF2, the first storage-selection transistor S1, a second storage-selection transistor S2, the bias transistor BIAS, a first read transistor READ1, and a second read transistor READ2.

Figure 6:
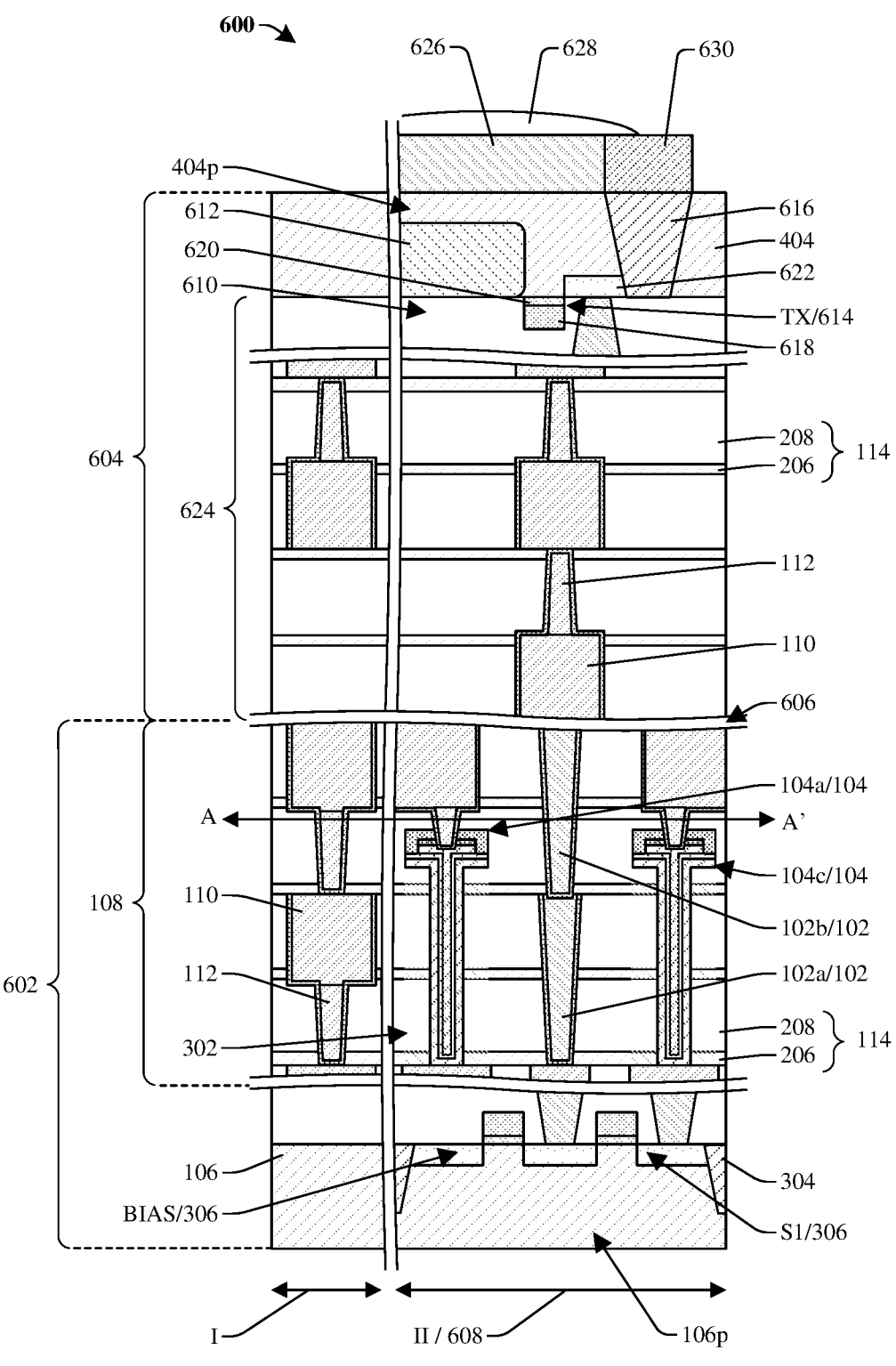
FIG. 6 illustrates a cross-sectional view of some embodiments of a three-dimensional (3D) integrated chip comprising a pixel and extended vias.

FIG. 6 illustrates a cross-sectional view of some embodiments of a three-dimensional (3D) integrated chip comprising a pixel and extended vias.

As shown in the cross-sectional view 600 of FIG. 6, the integrated chip of FIG. 3 (labeled as a first integrated chip 602) underlies and is bonded to a second integrated chip 604 at a bond interface 606. Further, a pixel 608 is spread across the first and second integrated chips 602, 604. The pixel 608 comprises a first pixel circuit 302 and a second pixel circuit 610 respectively at the first and second integrated chips 602, 604. The first pixel circuit 302 corresponds to the pixel circuit described with regard to FIGS. 3-5. The second pixel circuit comprises a photodiode 612 and a plurality of second transistors 614.

The second integrated chip 604 comprises a second substrate 404, at which the second pixel circuit 610 is arranged. The photodiode 612 of the second pixel circuit 610 is in the second substrate 404, at a second pixel region 404p. Further, the second transistors 614 are on the second substrate 404, at the second pixel region 404p. The second pixel region 404p corresponds to the second pixel region described with regard to FIG. 5, and is surrounded and demarcated by a second trench isolation structure 616. The second trench isolation structure 616 comprises dielectric material and may, for example, be or comprise a STI structure, a DTI structure, the like, or any combination of the foregoing.

The second transistors 614 comprise individual gate electrodes 618, individual gate dielectric layers 620, and corresponding pairs of source/drain regions 622. The gate electrodes 618 are stacked respectively with the gate dielectric layers 620 to form gate stacks, which are sandwiched between corresponding source/drain regions 622. At least one gate stack is sandwiched between a source/drain region 622 and the photodiode 612. Note that source/drain region(s) may refer to a source or a drain, individually or collectively dependent upon the context.

A second interconnect structure 624 underlies the second substrate 404, between the second substrate 404 and the first integrated chip 602. Further, the second interconnect structure 624 is as the interconnect structure 108 is described except for a different layout of wires and vias. As such, the second interconnect structure 624 comprises a plurality of wires 110 and a plurality of vias 112 in a dielectric structure 114, which comprises a plurality of ESLs 206 and a plurality of interconnect dielectric layers 208 that are alternatingly stacked.

The interconnect structure 108 and the second interconnect structure 624 physically and electrically couple together at the bond interface 606. Further, the interconnect structure 108 and the second interconnect structure 624 form conductive paths electrically coupling components of the pixel 608 together. For example, the second interconnect structure 624 electrically couples the extended vias 102 of the first integrated chip 602 to the second pixel circuit 610 of the second integrated chip 604.

A color filter 626 and a micro lens 628 overlie photodiode 612 and the second substrate 404. The color filter 626 is configured to receive radiation in route to the photodiode 612, and is configured filter the radiation to pass certain wavelengths of radiation while blocking other wavelengths of radiation. For example, the color filter 626 may pass red wavelengths of radiation while bocking other wavelengths of radiation (e.g., green and blue wavelengths). Further, the color filter 626 is surrounded by a grid structure 630 (only partially shown). The micro lens 628 is configured to focus the radiation on the photodiode 612. In alternative embodiments, color filter 626 and/or the micro lens 628 is/are omitted.

Figure 7:
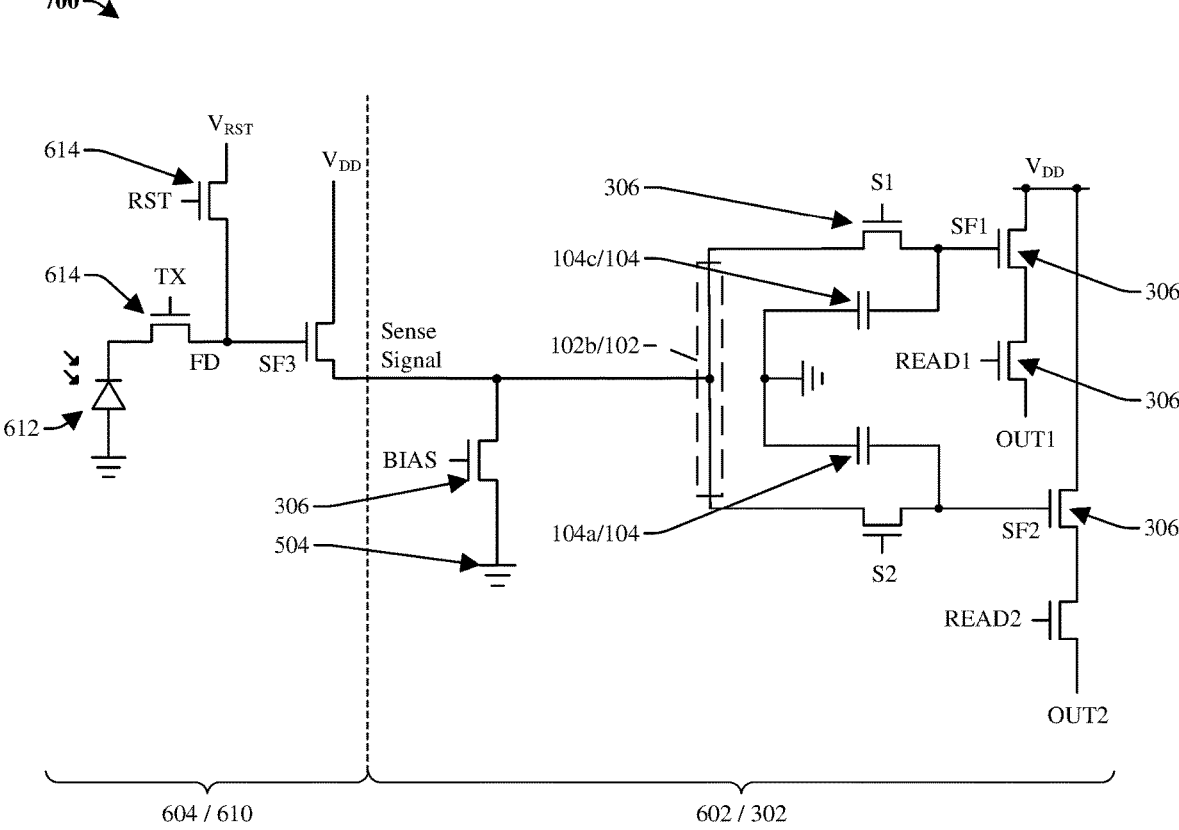
FIG. 7 illustrates a circuit diagram of some embodiments of the pixel of FIG. 6.

FIG. 7 illustrates a circuit diagram of some embodiments of the pixel of FIG. 6.

As shown in the circuit diagram 700 of FIG. 7, the first pixel circuit 302 is electrically coupled to the second pixel circuit 610 through a boundary between the first and second integrated chips 602, 604. The first pixel circuit 302 is as described with regard to FIG. 5, and hence comprises a plurality of transistors 306 interconnected by the interconnect structure 108 of the first integrated chip 602. The second pixel circuit 610 comprises a plurality of second transistors 614 and a photodiode 612 interconnected by the second interconnect structure 624 of the second integrated chip 604. The plurality of second transistors 614 comprises the transfer transistor TX, the reset transistor RST, and the third source-follower transistor SF3.

The photodiode 612 is electrically coupled from ground 504 or some other suitable voltage to the transfer transistor TX, and the transfer transistor TX is electrically coupled from the photodiode 612 to the reset transistor RST and the third source-follower transistor SF3. The photodiode 612 is configured to accumulate charge in response to radiation. The transfer transistor TX is configured to transfer the accumulated charge to a floating diffusion (FD) node at a source/drain region of the transfer transistor TX.

The FD node is electrically coupled to the reset transistor RST and gates the third source-follower transistor SF3. The reset transistor RST is electrically coupled from reset voltage $V_{RST}$ to the FD node. Through coordination with the transfer transistor TX, the reset transistor RST is configured to selectively electrically couple the photodiode 612 to the reset voltage $V_{RST}$ to reset the photodiode 612 to a pinning voltage. Further, the reset transistor RST is configured to selectively electrically couple the FD node to the reset voltage $V_{RST}$ to reset the FD node to the reset voltage $V_{RST}$.

The third source-follower transistor SF3 is gated by charge at the FD node, and is electrically coupled from a supply voltage $V_{DD}$ to the bias transistor BIAS. The third source-follower transistor SF3 is configured to buffer and amplify a voltage at the FD node to non-destructively read the voltage. The bias transistor BIAS selectively enables generation of the buffered and amplified voltage, which corresponds to the sense signal described with regard to FIGS. 3-5. When the bias transistor BIAS is in an ON state, current flows through third source-follower transistor SF3, whereby the third source-follower transistor SF3 buffers and amplifies a voltage at the FD node. When the bias transistor BIAS is in an OFF state, current flow is restricted, whereby buffering and amplifying of the voltage at the FD node is disabled.

Figure 8A:
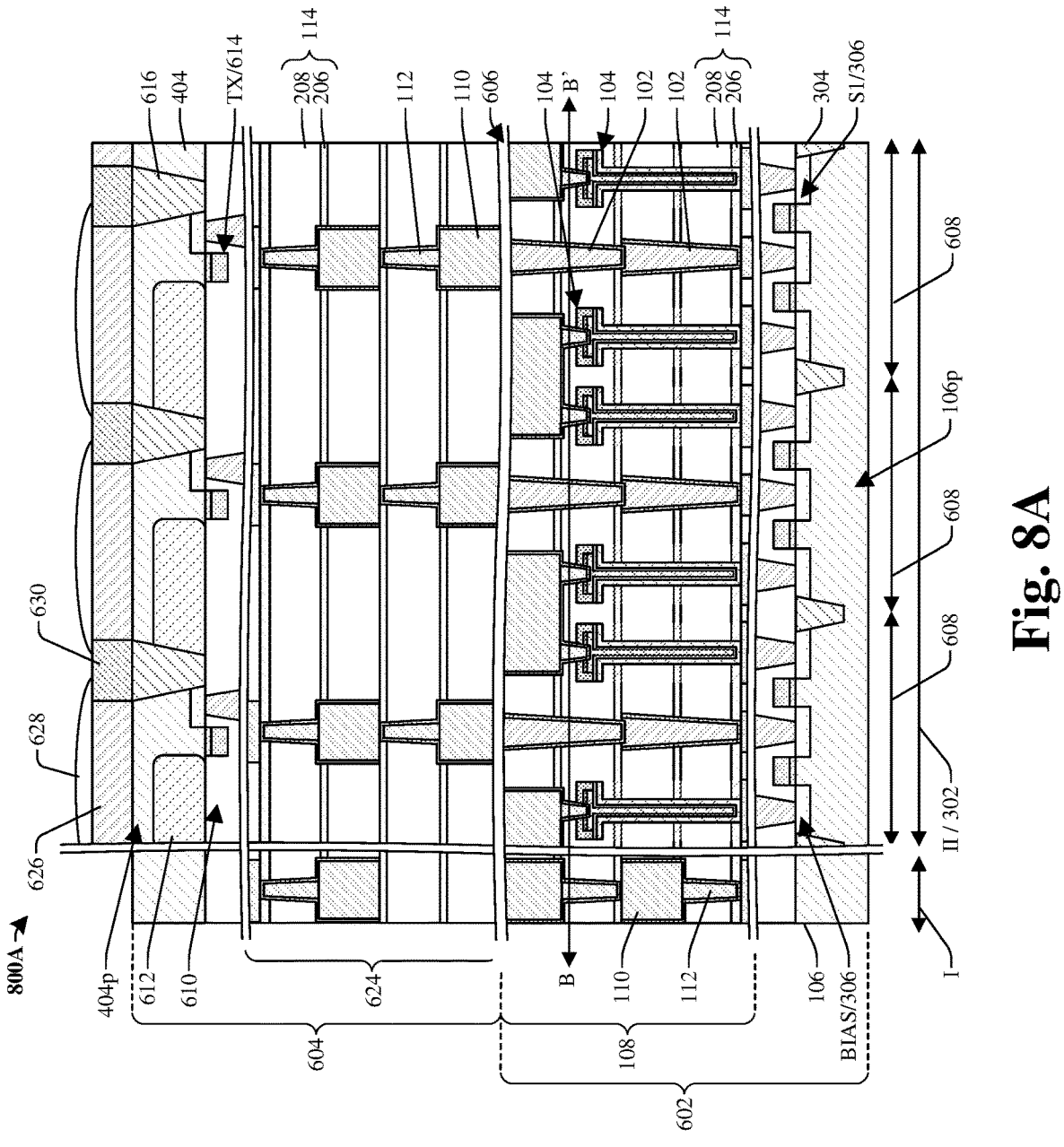
FIGS. 8A and 8B illustrate a cross-sectional view and a top layout view of some embodiments of a 3D integrated chip comprising pixels and extended vias.
Figure 8B:
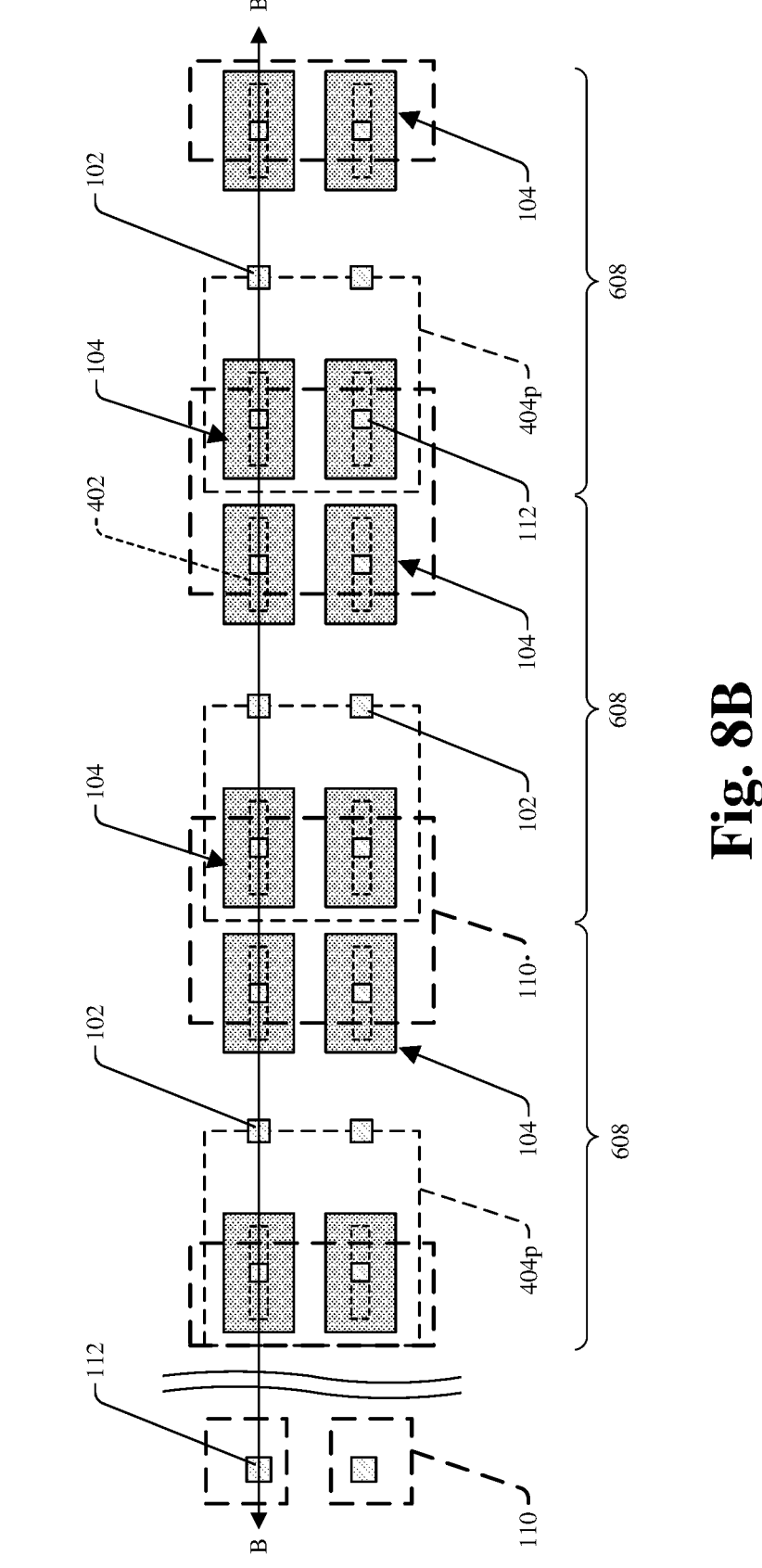

FIGS. 8A and 8B illustrate a cross-sectional view 800A and a top layout view 800B of some embodiments of an integrated chip comprising a plurality of pixels and a plurality of extended vias. The cross-sectional view 800A of FIG. 8A may, for example, be taken along line B-B' in FIG. 8B, and/or the top layout view 800B of FIG. 8B may, for example, be taken along line B-B' in FIG. 8A.

As shown in the cross-sectional view 800A in FIG. 8A and the top layout view 800B of FIG. 8B, the pixel 608 of FIG. 6 repeats. In some embodiments, the common wires 110 are coupled to capacitors both overlapping with and laterally offset from the second pixel region 404p. In some embodiments, the pixel 608 repeats in a plurality of rows and a plurality of columns to form a pixel array at the central region II.

FIGS. 9-23 illustrate a series of cross-sectional views 900-2300 of some embodiments of a method of forming an integrated chip comprising a pixel circuit and extended vias.

The method may, for example, be employed to form the integrated chip of FIG. 3 or the like. Although FIGS. 9-23 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figures 9, 10:
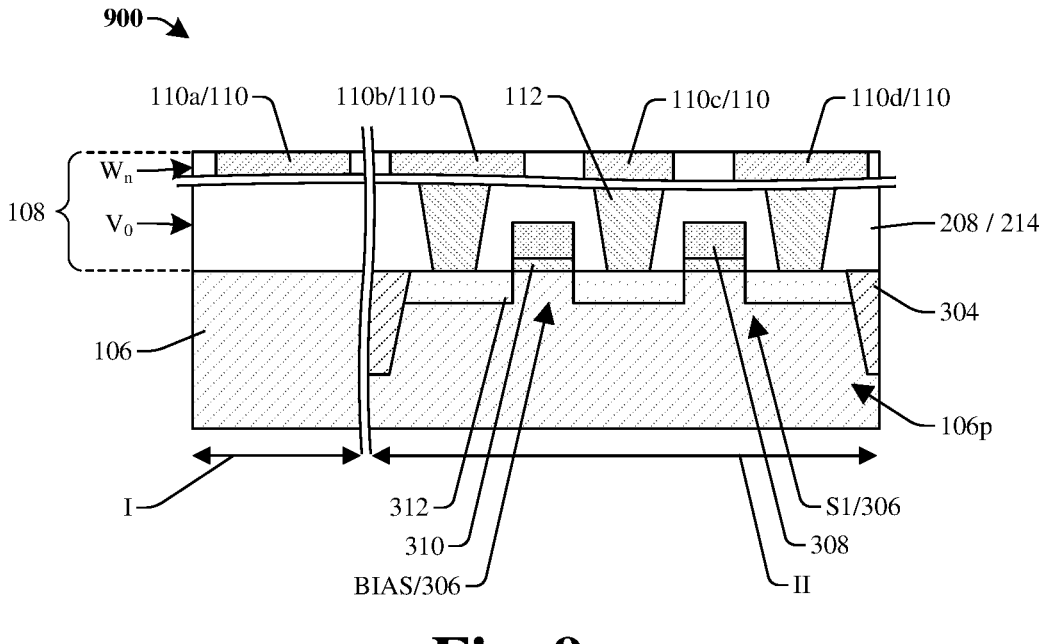
FIGS. 9-23 illustrate a series of cross-sectional views of some embodiments of a method of forming an integrated chip comprising a pixel circuit and extended vias.

As shown in the cross-sectional view 900 of FIG. 9, a plurality of transistors 306 are formed on a pixel region 106p of a substrate 106. The pixel region 106p is at a central region II of the integrated chip, and is surrounded and demarcated by a trench isolation structure 304. Further, the central region II of the integrated chip is surrounded by a peripheral region I (partially shown) of the integrated chip.

The transistors 306 comprise a bias transistor BIAS and a first storage-selection transistor S1. Further, the transistors 306 comprise individual gate electrodes 308, individual gate dielectric layers 310, and corresponding pairs of source/drain regions 312. The gate electrodes 308 are stacked respectively with the gate dielectric layers 310 to form gate stacks, which are sandwiched between corresponding source/drain regions 312.

Also shown in the cross-sectional view 900 of FIG. 9, an interconnect structure 108 is partially formed over and electrically coupled to the transistors 306. The interconnect structure 108 comprises a plurality of wires 110 and a plurality of vias 112 in a dielectric structure 114, which comprises a plurality of interconnect dielectric layers 208 and at least one ESL (not shown) separating the interconnect dielectric layers 208 from each other. The wires 110 provide lateral routing and have larger footprints (e.g., top down projections) than the vias 112. The vias 112 provide vertical routing between the wires 110.

The wires 110 are respectively grouped into wire levels and via levels that are alternatingly stacked to form conductive paths. A wire level $W_n$ is at a top of the interconnect structure 108, and a via level $V_0$ underlies and electrically couples to the wire level $W_n$. In some embodiments, the via level $V_0$ may also be regarded as a contact via level. Note that n is an integer representing a wire or via level and increases away from the substrate 106.

The wire level $W_n$ comprises a first wire 110a, a second wire 110b, a third wire 110c, and a fourth wire 110d. The third wire 110c overlies and is electrically coupled to the to a common source/drain region of the bias transistor BIAS and the first storage-selection transistor S1, whereas the second and fourth wires 110b, 110d overlie and are electrically coupled to individual source/drain regions of the bias transistor BIAS and the first storage-selection transistor S1. The first wire 110a is at the peripheral region I of the integrated chip.

As shown in the cross-sectional view 1000 of FIG. 10, a plurality of additional ESLs 206 and a plurality of additional interconnect dielectric layers 208 are deposited alternatingly stacked over the wire level $W_n$ to extend the dielectric structure 114. Note that for drawing compactness, a portion of the integrated chip below the wire level $W_n$ is not shown in FIG. 10 and subsequent figures, but the portion is still coupled to the first, second, third, and fourth wire levels 110a, 110b, 110c, 110d as previously discussed. The additional ESLs 206 and/or the additional interconnect dielectric layers 208 are formed using chemical vapor deposition (CVD), physical vapor deposition (PVD), atomic layer deposition (ALD), some other process, or a combination of the foregoing.

Also shown in the cross-sectional view 1000 of FIG. 10, a first hard mask layer 1002 is deposited over the additional ESLs 206 and the additional interconnect dielectric layers 208, and a first mask 1004 is formed over the first hard mask layer 1002. The first mask 1004 includes a plurality of first mask openings 1006 with a layout corresponding to vias to be formed hereafter. In some embodiments, the first hard mask layer 1002 is or comprises silicon oxynitride and/or other suitable materials. In some embodiments, the first mask 1004 is or comprises photoresist or other suitable materials, and/or is formed by photolithography or some other suitable process.

Figure 11:
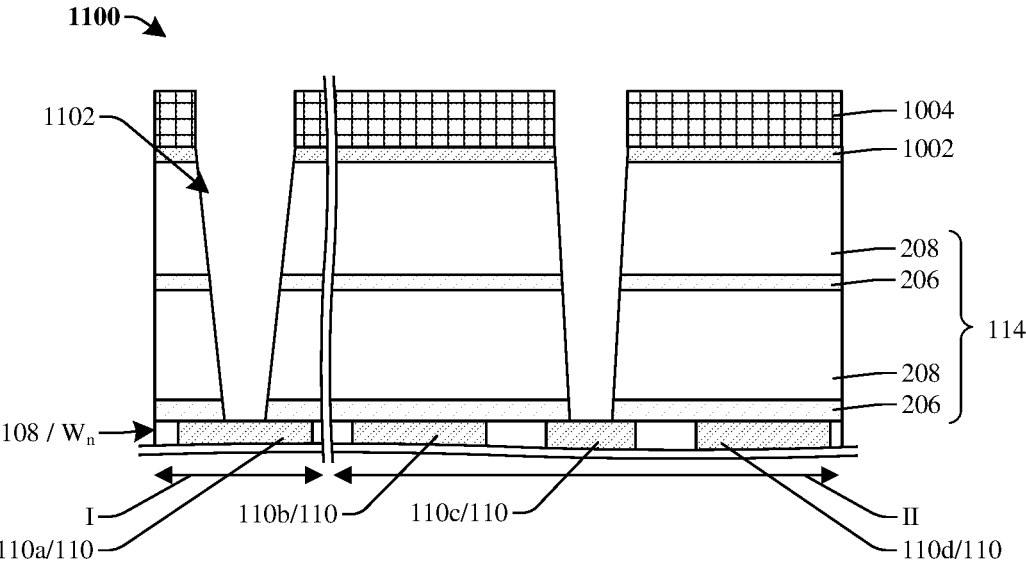

As shown in the cross-sectional view 1100 of FIG. 11, a first etch is performed into the dielectric structure 114 with the first mask 1004 in place to form a plurality of first via openings 1102 exposing corresponding wires 110 of the wire level W$_n$. Particularly, the first via openings 1102 respectively expose the first and third wires 110a, 110c.

Figure 12:
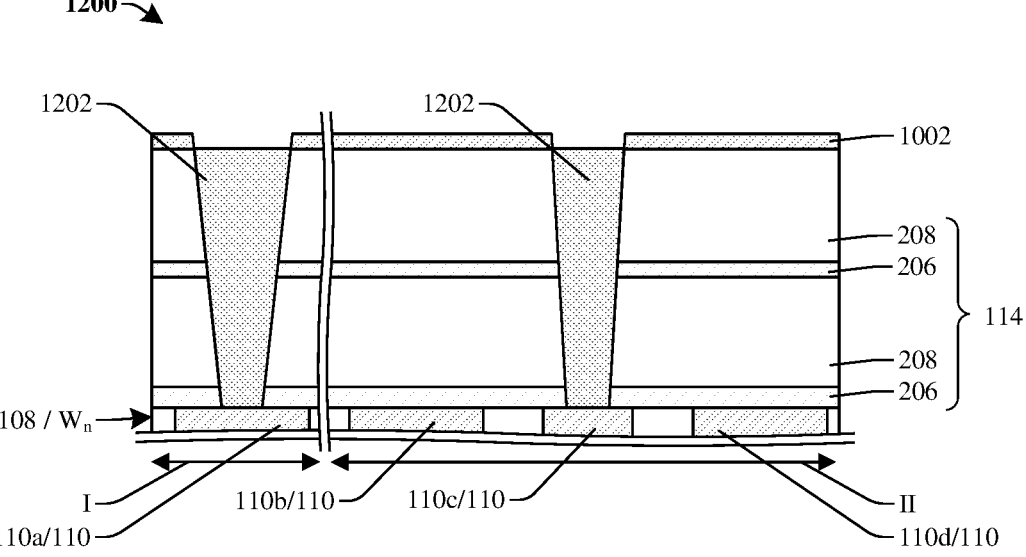

As shown in the cross-sectional view 1200 of FIG. 12, the first mask 1004 (see, e.g., FIG. 11) is removed, and the first via openings 1102 (see, e.g., FIG. 11) are filled with dielectric material. The dielectric material forms first plugs 1202 respectively in the first via openings 1102. In some embodiments, the first plugs 1202 have top surfaces recessed relative to a top surface of the dielectric structure 114. In other embodiments, the top surfaces of the first plugs 1202 are level with the top surface of the dielectric structure 114. A process for forming the first plugs 1202, for example, comprises depositing dielectric material filling the first via openings 1102, planarizing a top surface of the dielectric material, and etching back the dielectric material.

Figure 13:
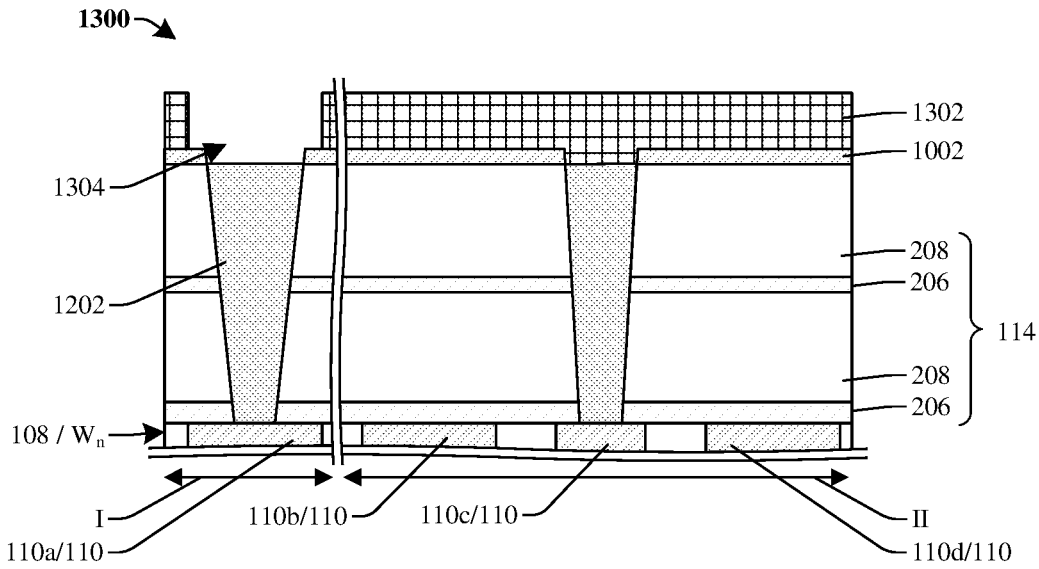

As shown in the cross-sectional view 1300 of FIG. 13, a second mask 1302 is formed over the first hard mask layer 1002. The second mask 1302 covers the second, third, and fourth wires 110b-110d. Further, the second mask 1302 includes a second mask opening 1304 overlying the first wire 110a with a layout corresponding to a wire to be formed hereafter. In some embodiments, the second mask 1302 is or comprise photoresist or other suitable materials, and/or is formed by photolithography or some other suitable process.

Figure 14:
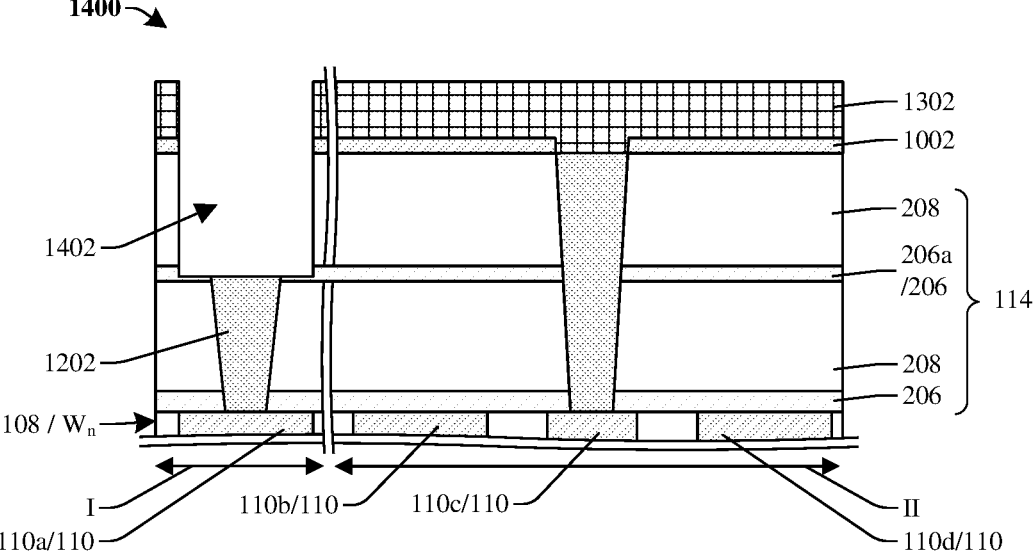

As shown in the cross-sectional view 1400 of FIG. 14, a second etch is performed into the dielectric structure 114 with the second mask 1302 in place and stops at an ESL 206a. The second etch forms a first wire opening 1402 overlying the first wire 110a and recesses the first plug 1202 at the first wire opening 1402. Further, the first wire opening 1402 has a greater width than the first via openings 1102 formed by the processing described with regard to FIG. 11.

Figure 15:
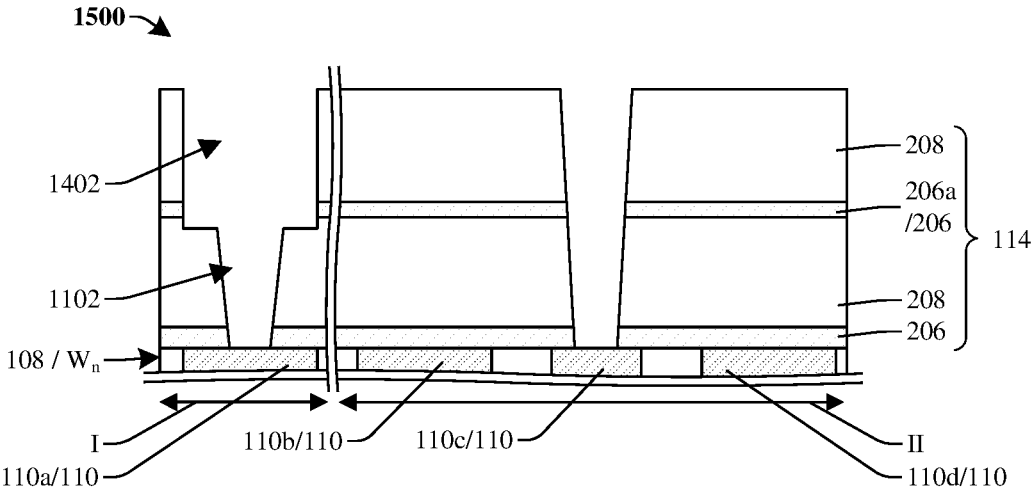

As shown in the cross-sectional view 1500 of FIG. 15, the second mask 1302 (see, e.g., FIG. 14), the first plugs 1202 (see, e.g., FIG. 14), and the first hard mask layer 1002 (see, e.g., FIG. 14) are removed. The removal removes the first plugs 1202 exposes the first via openings 1102 and the first and third wires 110a, 110c. Further, the removal extends the first wire opening 1402 through the ESL 206a at the bottom of the first wire opening 1402 and extends the first wire opening 1402 further into the dielectric structure 114. The removal may, for example, be performed using one or more etching processes, another suitable process, or a combination of one or more processes.

Figure 16:
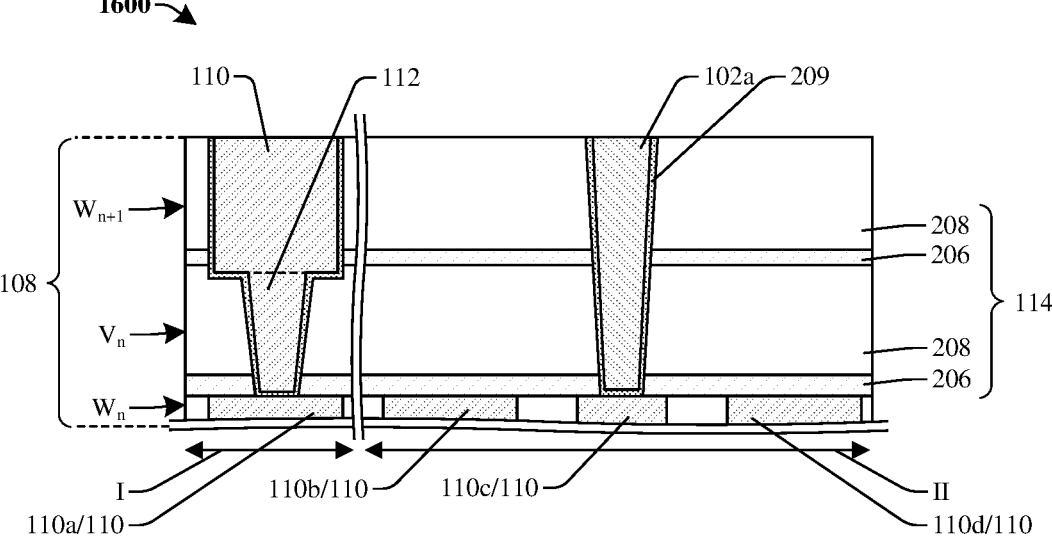

As shown in the cross-sectional view 1600 of FIG. 16, the first via and wire openings 1102, 1402 (see, e.g., FIG. 15) are filled with a conductive material, thereby extending the interconnect structure 108. The conductive material extends the interconnect structure 108 with a wire level W$_{n+1}$ and a via level V$_n$ between the wire level W$_{n+1}$ and the W$_n$, and further with a first extended via 102a. The first extended via

102a has a combined height greater than or equal to a combined height of a wire 110 and a via 112.

A process for filling the first via and wire openings 1102, 1402 may, for example, comprise depositing the conductive material in the first via and wire openings 1102, 1402 and performing a planarization into the conductive material to expose the dielectric structure 114. The depositing may, for example, be performed by CVD, PVD, ALD, sputtering, electrochemical plating, electroless plating, some other suitable deposition process, or a combination of the foregoing. The planarization may, for example, be performed by a chemical mechanical planarization (CMP) process or some other suitable process.

The first extended via 102a replace a wire and an adjoining via similar to those at the peripheral region I of the integrated chip. Supposing sizing and spacing of the replaced wire were at lower limits (below which leakage and capacitance effects would become unmanageable), the replaced wire would limit scaling down of the integrated chip. However, because the first extended via 102a has a lesser width and a lesser footprint (e.g., a lesser top down projection on a top surface of the substrate 106 of FIG. 9) than the replaced wire, the replacement relaxes spacing and sizing constrains and allows further scaling down.

Figure 17:
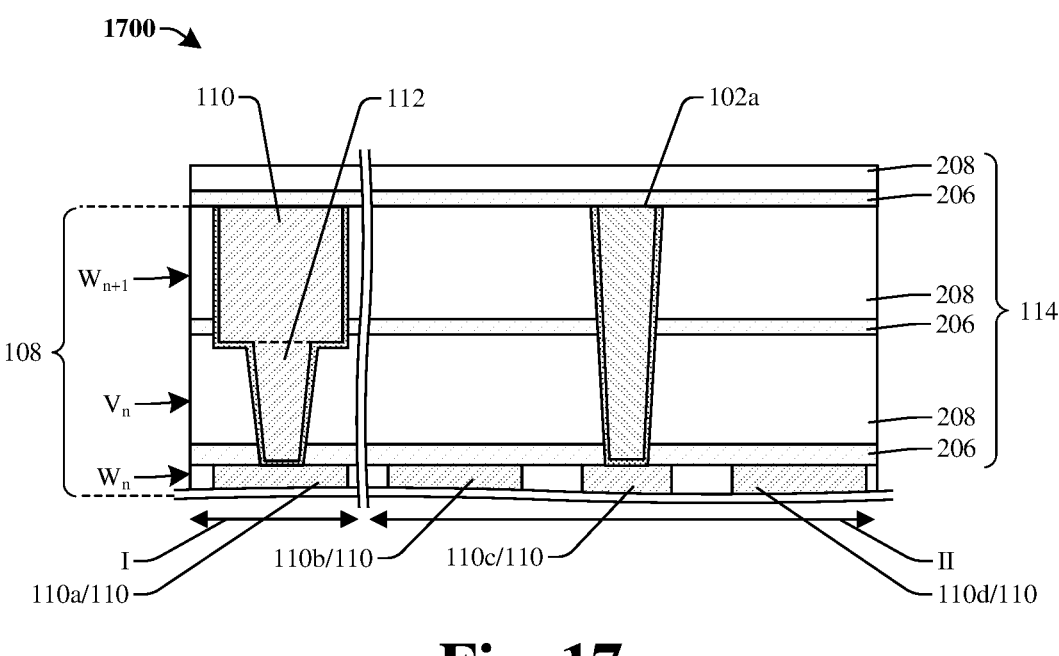

As shown in the cross-sectional view 1700 of FIG. 17, an additional ESL 206 and an additional interconnect dielectric layer 208 are deposited covering the first extended via 102a and the wire level W$_{n+1}$.

Figure 18:
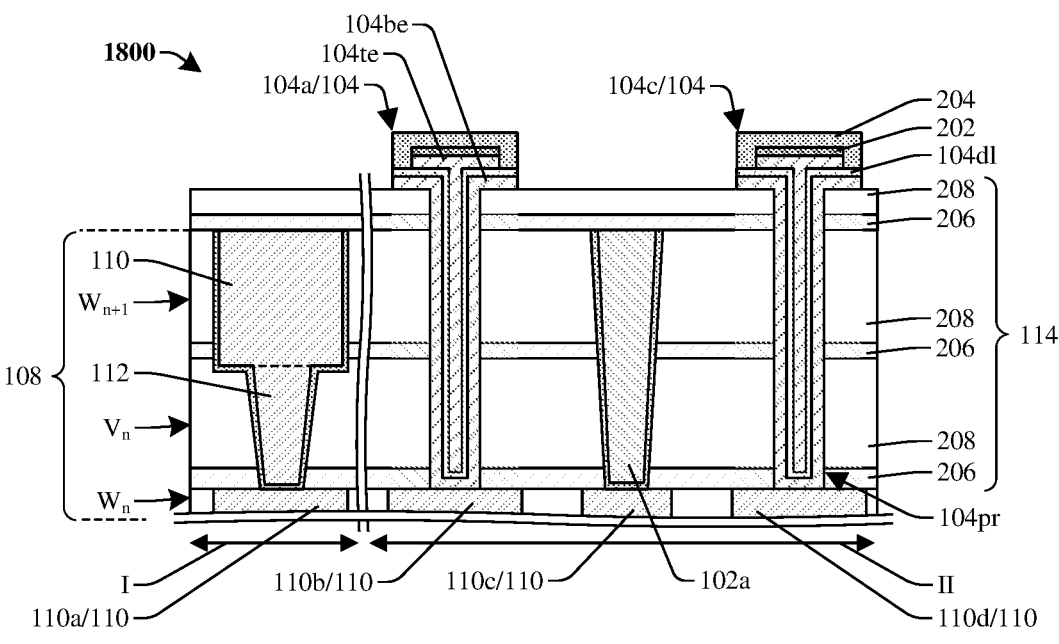

As shown in the cross-sectional view 1800 of FIG. 18, a plurality of capacitors 104 are formed on the dielectric structure 114 with individual protrusions 104pr protruding through the dielectric structure 114 respectively to the second and fourth wires 110b, 110d. The plurality of capacitors 104 comprises a first capacitor 104a and a third capacitor 104c respectively on the second and fourth wires 110b, 110d. The first and third capacitors 104a, 104c are trench capacitors and comprises individual bottom electrodes 104be, individual dielectric layers 104dl, and individual top electrode 104te forming the protrusions 104pr. The dielectric layers 104dl respectively overlie the bottom electrodes 104be, and top electrode 104te respectively overlie the dielectric layers 104dl.

Figure 19:
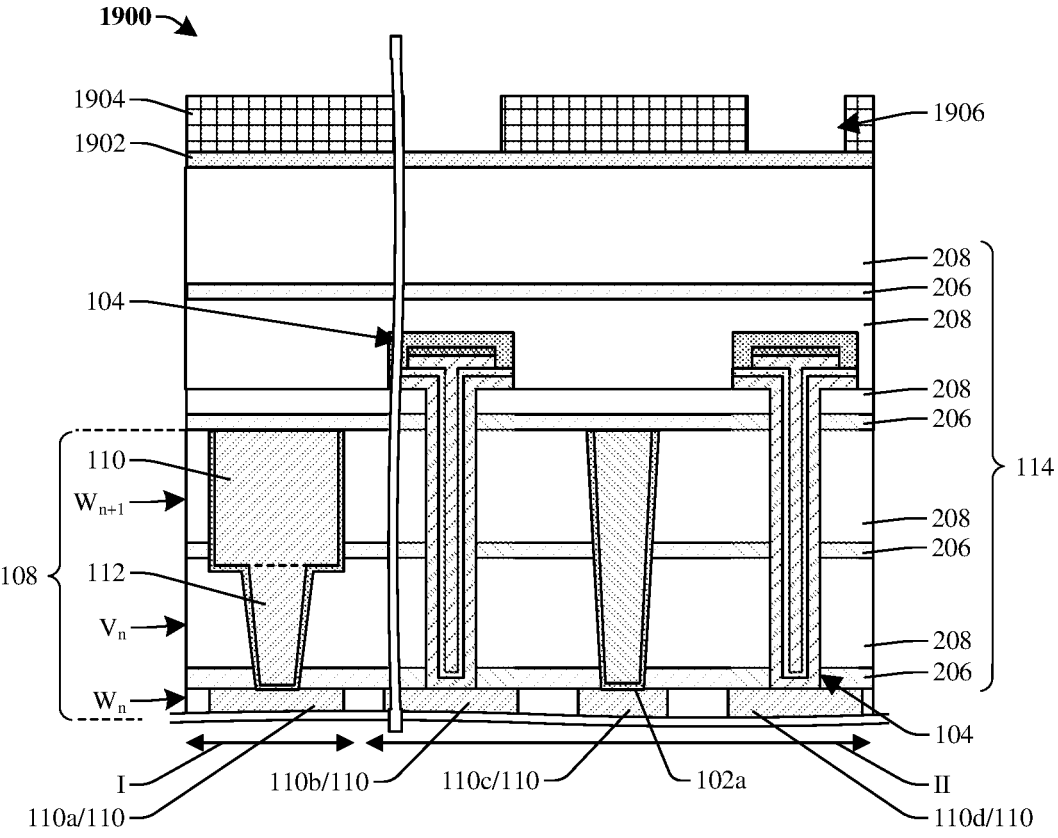

As shown in the cross-sectional view 1900 of FIG. 19, the acts described with regard to FIG. 10 are repeated. A plurality of additional ESLs 206 and a plurality of additional interconnect dielectric layers 208 are deposited alternatingly stacked over the wire level W$_{n+1}$ to extend the dielectric structure 114. Further, a second hard mask layer 1902 is deposited over the additional ESLs 206 and the additional interconnect dielectric layers 208, and a third mask 1904 is formed over the second hard mask layer 1902. The third mask 1904 includes a plurality of third mask openings 1906 with a layout corresponding to vias to be formed hereafter.

Figure 20:
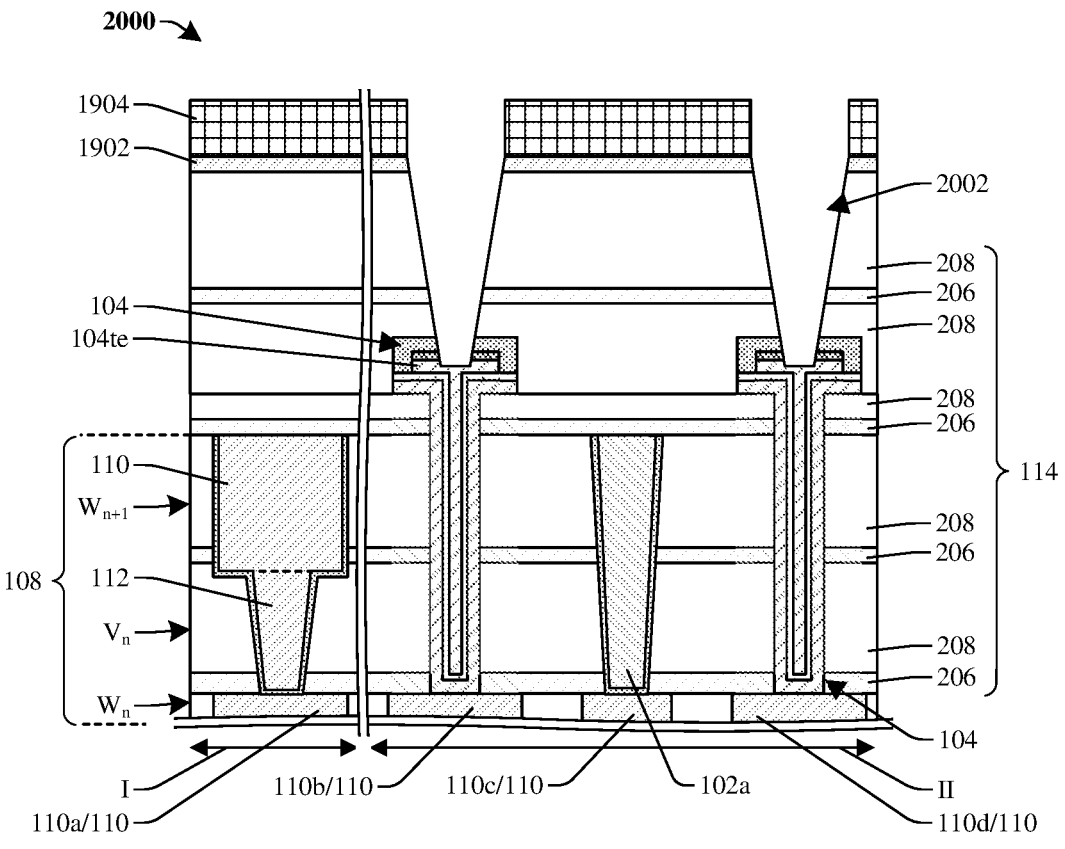

As shown in the cross-sectional view 2000 of FIG. 20, a third etch is performed into the dielectric structure 114 with the third mask 1904 in place to form a plurality of second via openings 2002 respectively exposing the capacitors 104. Particularly, the second via openings 2002 expose top electrodes 104te respectively of the capacitors 104.

Figure 21:
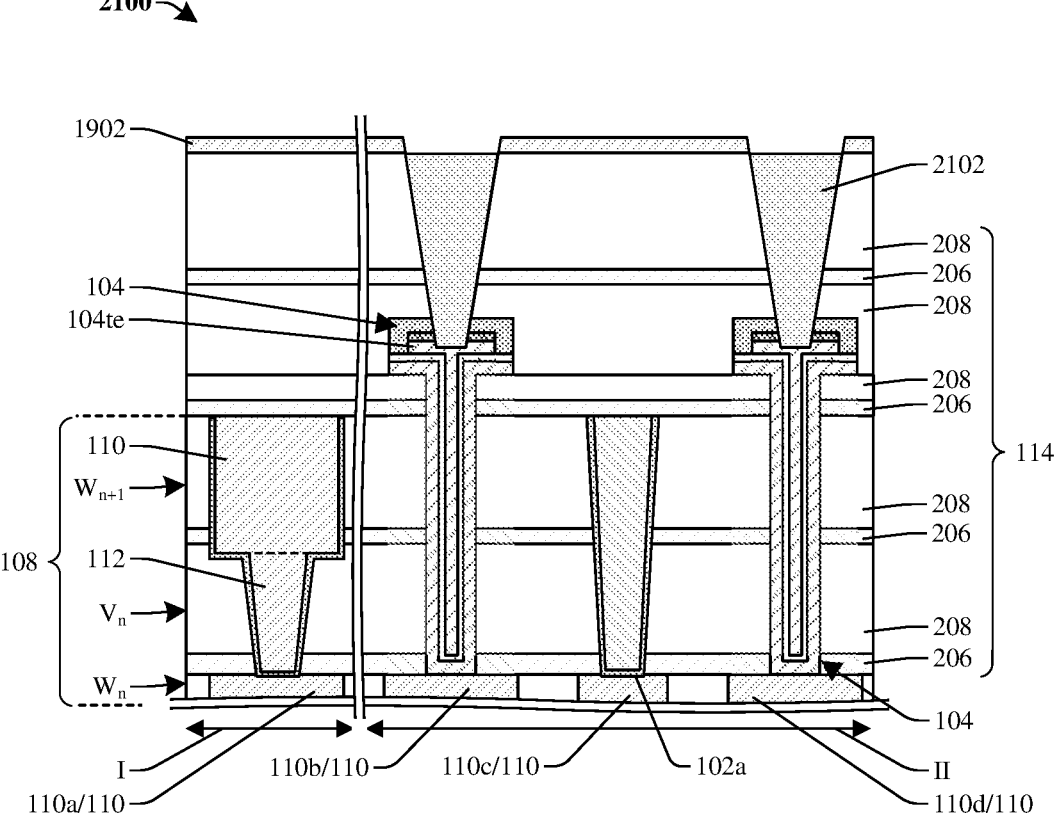

As shown in the cross-sectional view 2100 of FIG. 21, the third mask 1904 (see, e.g., FIG. 20) is removed, and the second via openings 2002 (see, e.g., FIG. 20) are filled with dielectric material. The dielectric material forms second plugs 2102 respectively in the second via openings 2002. A process for forming the second plugs 2102, for example, comprises depositing dielectric material filling the second via openings 2002, planarizing a top surface of the dielectric material, and etching back the dielectric material.

Figure 22:
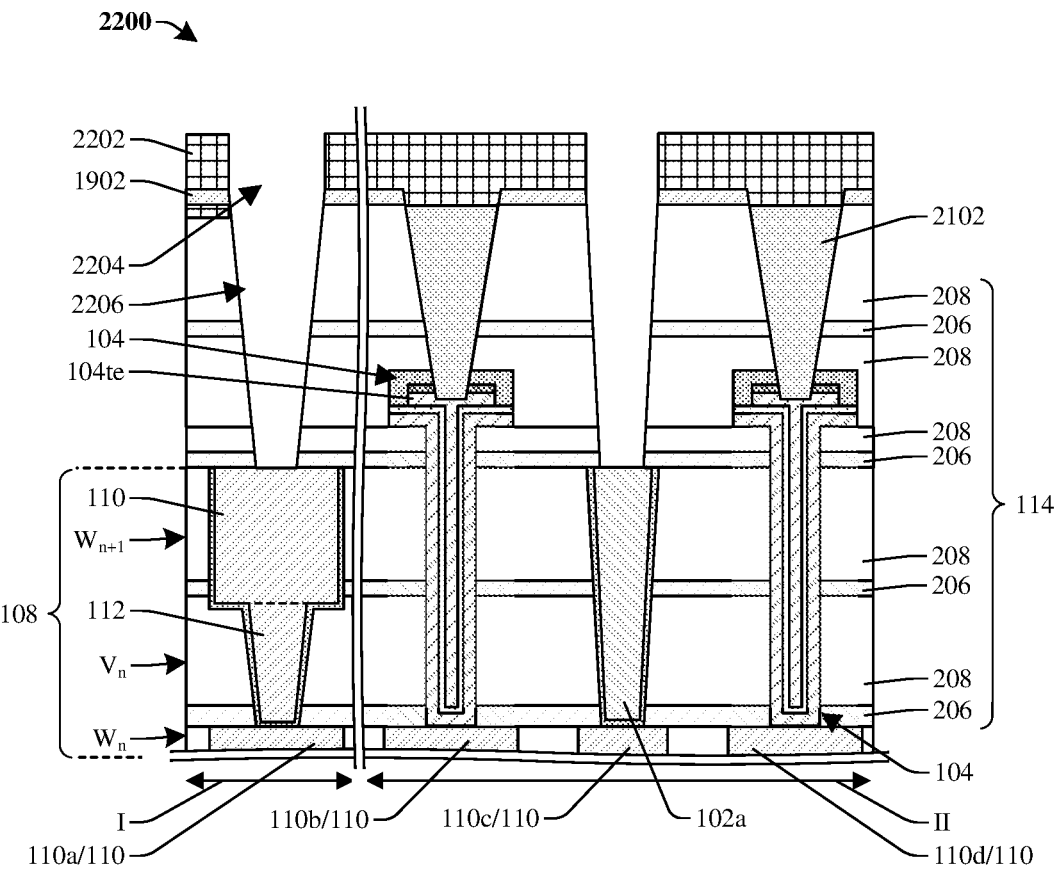

As shown in the cross-sectional view 2200 of FIG. 22, a fourth mask 2202 is formed over the second hard mask layer 1902. The fourth mask 2202 includes a plurality of fourth mask openings 2204 with a layout corresponding to vias to be formed hereafter. In some embodiments, the layout is the same as the layout of the first mask 1004 of FIG. 11.

Also shown in the cross-sectional view 2200 of FIG. 22, a fourth etch is performed into the dielectric structure 114 with the fourth mask 2202 in place to form third via openings 2206 exposing the extended via 102 and the wire 110 at the wire level $W_{n+1}$.

Figure 23:
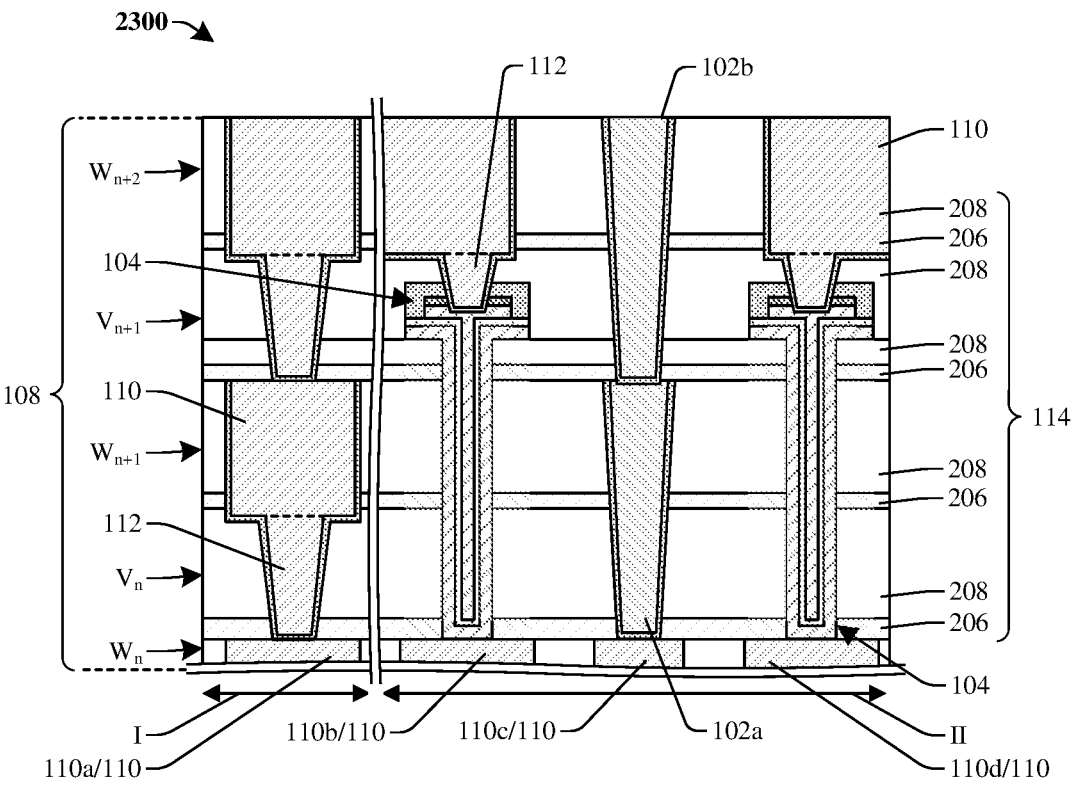

As shown in the cross-sectional view 2300 of FIG. 23, the interconnect structure 108 is extended. In particular, the interconnect structure 108 is extended with a wire level $W_{n+2}$ and a via level $V_{n+1}$ between the wire level $W_{n+2}$ and the $W_{n+1}$, and is further extended with a second extended via 102b on the first extended via 102a.

To extend the interconnect structure 108, the acts described with regard to FIGS. 12-16 are repeated to extend. Third plugs are formed in the third via openings 2206 (see, e.g., FIG. 22) in accordance with the acts described with regard to FIG. 12. A mask is formed over the dielectric structure in accordance with the acts described with regard to FIG. 13, and a fifth etch is performed into the dielectric structure 114, the second plugs 2102, and one of the third plugs to form second wire openings in accordance with the acts described with regard to FIG. 14. The second plugs 2102, the third plugs, and the second hard mask layer 1902 are removed in accordance with the acts described with regard to FIG. 15. The second and third via openings 2002, 2206 and the wiring openings are filled with conductive material to form the wire level $W_{n+2}$, the via level $V_{n+1}$, and the second extended via 102b in accordance with the acts described with regard to FIG. 16.

In some embodiments, additional processing is hereafter performed to complete the interconnect structure 108. In other embodiments, the interconnect structure 108 is completed upon completion of the acts described with regard to FIG. 23.

At completion of the interconnect structure 108, the transistors 306 described with regard to FIG. 8 and the capacitors 104 form a pixel circuit configured to facilitate readout of a photodiode. The pixel circuit may, for example, be as illustrated and described with regard to FIGS. 3-5. In some embodiments, the method described by FIGS. 9-23 may proceed to bonding another integrated chip to the integrated chip as shown at FIGS. 6 and 7. In FIGS. 6 and 7, the first integrated chip 602 corresponds to the integrated chip formed by FIGS. 9-23, whereas the second integrated chip 604 corresponds to the other integrated chip.

Figure 24:
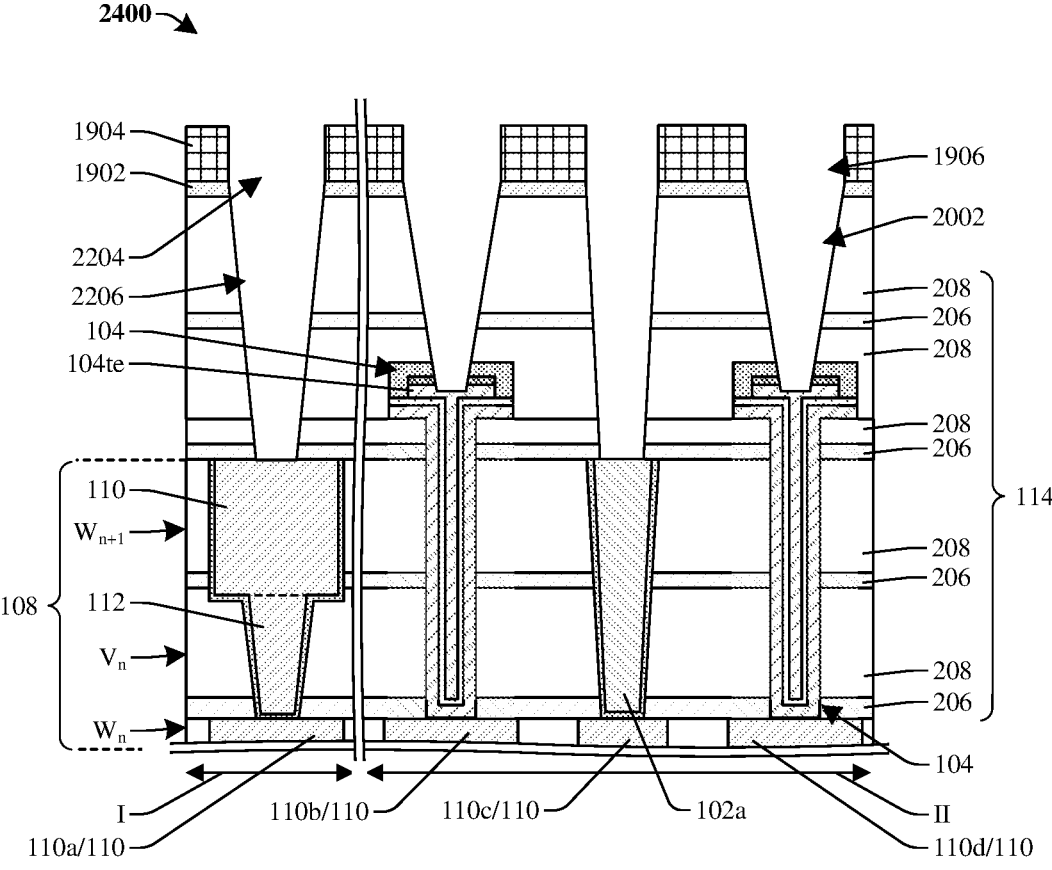
FIG. 24 illustrates a cross-sectional view of some embodiments of an alternative method of forming an integrated chip comprising a pixel circuit and extended vias.

FIG. 24 illustrates a cross-sectional view 2400 of some embodiments of an alternative method of forming an integrated chip comprising a pixel circuit and extended vias. In some embodiments, instead of forming the plurality of second via openings 2002 and the plurality of third via openings 2206 in separate steps, the third mask 1904 includes both the plurality of third mask openings 1906 and the plurality of fourth mask openings 2204, such that the second via openings 2002 and the third via openings 2206 may be fabricated in parallel.

FIG. 25 illustrates a flow diagram 2500 of some embodiments of a method of forming an integrated chip comprising a pixel circuit and extended vias.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2502, an interconnect structure is partially formed overlying a substrate, wherein a wire level at a top of the interconnect structure comprises a first wire, a second wire, a third wire, and a fourth wire, wherein the third wire is between and borders the second and fourth wires. See, for example, FIG. 9.

At 2504, a dielectric structure is formed overlying interconnect structure. See, for example, FIG. 10.

At 2506, a first etch is performed into the dielectric structure to form a first via opening and a second via opening respectively exposing the first and third wires. See, for example, FIG. 11.

At 2508, the first and second via openings are filled with dielectric plugs. See, for example, FIG. 12.

At 2510, a second etch is performed into the dielectric structure to form a wire opening overlapping with the first via opening while the second via opening is masked, wherein the wire opening has a greater width than the first via opening. See, for example, FIG. 13.

At 2512, the dielectric plugs are removed from the first and second via openings. See, for example, FIG. 14.

At 2514, the first and second via openings and the wire opening are filled to form a fifth wire, a via, and an extended via, which extend the interconnect structure, wherein the fifth wire and the via are formed respectively in the first via opening and the wire opening, and wherein the extended via is formed in the second via opening and has a height greater than or equal to a combined height of the fifth wire and the via. See, for example, FIG. 16.

At 2516, capacitors are formed respectively on opposite sides of the extended via and have protrusions protruding through the dielectric structure respectively to the second and fourth wires. See, for example, FIGS. 17 and 18.

At 2518, the interconnect structure is completed over the capacitors. See, for example, FIGS. 19-23.

Therefore, the present disclosure relates to a method of manufacturing integrated chips that form extended vias between the capacitors to increase pixel density without altering the minimum distance between components.

Some embodiments relate to an integrated chip including a substrate and a capacitor over the substrate having a bottom protrusion extending towards the substrate. A first common wire and a first capacitor via are over the capacitor, the first capacitor via extending from the first common wire to the capacitor. Also included is an extended via bordering the capacitor, where the extended via extends from an elevation level with a top surface of the first common wire to an elevation level with the bottom protrusion.

In other embodiments, the present disclosure relates to a semiconductor structure including a substrate and a pixel circuit on the substrate, the pixel circuit comprising a plurality of transistors. An interconnect structure is on the substrate, the interconnect structure comprising a plurality of wires and a plurality of vias respectively grouped into a plurality of wire levels and a plurality of via levels that are alternatingly stacked, where the interconnect structure further comprises an extended via. The interconnect structure interconnects the transistors, and the extended via partially forms the pixel circuit and has a height greater than a combined height of a wire level and a via level of the interconnect structure.

In yet other embodiments, the present disclosure relates to a method of forming an integrated chip, the method including forming a dielectric structure overlying a first wire and a second wire; performing a first etch into the dielectric structure to form a first via opening and a second via opening, respectively exposing the first and second wires; filling the first and second via opening respectively with a first dielectric plug and a second dielectric plug; performing a second etch into the dielectric structure to form a wire opening overlapping with the first via opening while the second via opening is masked, where the wire opening has a greater width than the first via opening; removing the first and second dielectric plugs; filling the first and second via openings and the wire opening with conductive material to form a third wire, a via, and an extended via respectively in the wire opening, the first via opening, and the second via opening, where the extended via has a height greater than a combined height of the via and the third wire.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a first dielectric layer, a second dielectric layer, and a first etch stop layer separating the first dielectric layer and the second dielectric layer over a substrate, wherein the second dielectric layer is over the first dielectric layer, and wherein the first dielectric layer overlies a first wire and a second wire;
   performing a first etch into the first dielectric layer and the second dielectric layer to form a first via opening and a second via opening extending from a top surface of the second dielectric layer to a bottom surface of the first dielectric layer and respectively exposing the first and second wires;
   filling the first and second via openings respectively with a first dielectric plug and a second dielectric plug;
   performing a second etch into the second dielectric layer, removing portions of the second dielectric layer surrounding the first via opening to form a wire opening in the second dielectric layer overlapping with the first via opening while the second via opening is masked, wherein the wire opening has a greater width than the first via opening;
   removing the first and second dielectric plugs;
   filling the first and second via openings and the wire opening by depositing a conductive material in the first via opening, the first wire opening, and the second via opening; and
   removing portions of the conductive material above the second dielectric layer, exposing the second dielectric layer, and resulting in a via remaining in the first dielectric layer, a third wire remaining in the second dielectric layer, and an extended via extending from the top surface of the second dielectric layer to the bottom surface of the first dielectric layer,
   wherein the extended via has a height greater than or equal to a combined height of the via and the third wire.

2. The method according to claim 1, further comprising:
   depositing a third dielectric layer covering the third wire and the extended via; and
   forming a trench capacitor overlying the third dielectric layer and having a bottom protrusion protruding downward to a fourth wire level with the first and second wires.

3. The method according to claim 2, further comprising:
   depositing a fourth dielectric layer over the third dielectric layer and the trench capacitor;
   performing a third etch through the fourth dielectric layer to form a third via opening exposing the extended via; and
   filling the third via opening with conductive material to form a second extended via overlying the extended via and sharing a common height with the extended via.

4. The method of claim 2, further comprising forming a second trench capacitor on an opposite side of the extended via as the trench capacitor, wherein the trench capacitor and the second trench capacitor are separated by a distance of less than 0.8 micrometers.

5. The method according to claim 1, where during the removal of the first dielectric plug, a portion of the first dielectric layer is removed beneath the wire opening, extending the wire opening into the first dielectric layer.

6. The method of claim 1, wherein the first wire and the second wire are spaced in a lateral direction by a fourth wire.

7. A method of forming an integrated device, the method comprising:
   forming a first dielectric layer, a second dielectric layer, and a first etch stop layer separating the first dielectric layer and the second dielectric layer over a substrate, wherein the second dielectric layer is over the first dielectric layer;
   forming a first via opening and a second via opening extending from a top surface of the second dielectric layer to a bottom surface of the first dielectric layer;
   removing portions of the second dielectric layer surrounding the first via opening to form a first wire opening in the second dielectric layer;
   depositing a conductive material in the first via opening, the first wire opening, and the second via opening; and
   removing portions of the conductive material above the second dielectric layer, exposing the second dielectric layer, and resulting in a first via remaining in the first dielectric layer, a first wire remaining in the second dielectric layer, and a first extended via extending from the top surface of the second dielectric layer to the bottom surface of the first dielectric layer.

8. The method of claim 7, wherein after depositing the conductive material, the conductive material extends from below the bottom surface of the first dielectric layer to over the top surface of the second dielectric layer by extending through the second via opening.

9. The method of claim 7, further comprising:

forming a first capacitor over the substrate, the first capacitor having a protrusion that extends through the first dielectric layer and the second dielectric layer;

forming a third dielectric layer, a fourth dielectric layer, and a second etch stop layer over the first capacitor, wherein the second etch stop layer separates the third dielectric layer and the fourth dielectric layer, and wherein the fourth dielectric layer is over the third dielectric layer; and concurrently forming a third via in the third dielectric layer and coupled to the first wire, a second wire in the fourth dielectric layer and coupled to the third via, a fourth via in the third dielectric layer and coupled to the first capacitor, a third wire in the fourth dielectric layer coupled to the fourth via, and a second extend via extending through the third dielectric layer, the second etch stop layer, and the fourth dielectric layer to contact the first extend via and to reach the top surface of the fourth dielectric layer.

10. The method of claim 9, wherein the first capacitor is spaced from the first extended via or the second extended via by a distance of less than .5 micrometers.

11. The method of claim 7, wherein the first wire has a first width and the first extended via has a second width that is less than the first width.

12. The method of claim 7, further comprising:

forming first plugs within the first via opening and the second via opening before removing portions of the second dielectric layer surrounding the first via opening; and forming a masking layer overlying the second dielectric layer, wherein the masking layer is patterned to expose a first plug in the first via opening and to cover a second plug in the second via opening.

13. The method of claim 7, further comprising forming a barrier layer within the second via opening before depositing the conductive material within the second via opening.

14. A method of forming an integrated chip, comprising:

forming a first dielectric layer corresponding to a first via level, a second dielectric layer corresponding to a first wire level, and a first etch stop layer separating the first dielectric layer and the second dielectric layer over a substrate, wherein the second dielectric layer is over the first dielectric layer, and wherein the first dielectric layer, the second dielectric layer, and the first etch stop layer are over a first wire and a second wire;

forming a first via opening over the first wire, wherein the first via opening extends both from a top surface of the second dielectric layer to a bottom surface of the first dielectric layer and through the first wire level and into the first via level;

forming a second via opening over the second wire, wherein the second via opening extends both from a top surface of the second dielectric layer to a bottom surface of the first dielectric layer and through the first wire level and into the first via level;;

filling the first and second via openings respectively with a first dielectric plug and a second dielectric plug;

forming a masking layer over the second dielectric layer;

patterning the masking layer to expose the first dielectric plug, wherein the second dielectric plug remains covered after the patterning;

performing an etch, removing portions of the first dielectric plug and the second dielectric layer surrounding the first via opening to form a first wire opening in the second dielectric layer;

removing remaining portions of the first dielectric plug, the second dielectric plug, and the masking layer;

depositing a conductive material in the first via opening, the second via opening, and the first wire opening; and removing portions of the conductive material above the second dielectric layer, exposing the second dielectric layer, and resulting in a first via remaining in the first dielectric layer, an overlying wire remaining in the second dielectric layer, and a first extended via extending from the top surface of the second dielectric layer to the bottom surface of the first dielectric layer.

15. The method of claim 14, wherein the first extended via has a height greater than a combined height of the first via and the overlying wire.

16. The method of claim 14, further comprising forming a capacitor on the first wire before forming the first dielectric layer and the second dielectric layer, wherein the first via opening exposes a top electrode of the capacitor and wherein the second via opening extends through the first dielectric layer and the second dielectric layer.

17. The method of claim 16, further comprising forming a second extended via before forming the capacitor, wherein the second via opening exposes a top surface of the second extended via, and wherein the second via opening has a height greater than a height of the first via opening.

18. The method of claim 14, wherein the first via opening and the second via opening are concurrently etched into the first wire level.

19. The method of claim 14, wherein the first via opening is etched into the first via level and the first wire level before the second via opening is etched into the first via level and the first wire level.

20. The method of claim 14, wherein the first via extends from a bottom surface of the overlying wire to the first wire and wherein the first extended via extends from a top surface of the overlying wire to the second wire.

* * * * *